(12) United States Patent
Essig et al.

(10) Patent No.: US 9,991,193 B2
(45) Date of Patent: Jun. 5, 2018

(54) SEMICONDUCTOR DEVICE PACKAGE

(71) Applicant: Advanced Semiconductor Engineering, Inc., Kaohsiung (TW)

(72) Inventors: Kay Stefan Essig, Kaohsiung (TW); Chi-Tsung Chiu, Kaohsiung (TW); Hui Hua Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/621,968

(22) Filed: Jun. 13, 2017

(65) Prior Publication Data

US 2017/0365542 A1 Dec. 21, 2017

Related U.S. Application Data

(60) Provisional application No. 62/350,622, filed on Jun. 15, 2016.

(51) Int. Cl.
*H01L 23/495* (2006.01)

(52) U.S. Cl.
CPC .. *H01L 23/49575* (2013.01); *H01L 23/49513* (2013.01); *H01L 23/49517* (2013.01)

(58) Field of Classification Search
CPC ... H01L 23/00; H01L 23/49; H01L 23/49575; H01L 23/04; H01L 23/043; H01L 23/24; H01L 23/31; H01L 23/49513; H01L 23/49517; H01L 23/495; H01L 23/3114; H01L 2933/0091; H01L 2933/0083

USPC .......................................................... 257/676
See application file for complete search history.

(56) References Cited

U.S. PATENT DOCUMENTS

| | | | |
|---|---|---|---|
| 5,886,399 A | 3/1999 | Ohsawa et al. | |
| 7,759,777 B2 | 7/2010 | Otremba et al. | |
| 7,964,957 B2 | 6/2011 | Noguchi et al. | |
| 8,030,131 B2 | 10/2011 | Otremba et al. | |
| 8,120,158 B2 | 2/2012 | Ewe et al. | |
| 8,487,426 B2 | 7/2013 | Essig et al. | |
| 9,331,003 B1 | 5/2016 | Camacho et al. | |
| 2014/0118976 A1* | 5/2014 | Yoshikawa | H01L 23/49822 361/763 |
| 2016/0218019 A1* | 7/2016 | Su | H01L 21/6835 |
| 2017/0141087 A1* | 5/2017 | Vincent | H01L 25/105 |

OTHER PUBLICATIONS

Non-Final Office Action for U.S. Appl. No. 15/621,970, dated Jan. 12, 2018.

* cited by examiner

*Primary Examiner* — Chuong A Luu
(74) *Attorney, Agent, or Firm* — Foley & Lardner LLP; Cliff Z. Liu

(57) ABSTRACT

A semiconductor device package includes a first conductive base, a first semiconductor die, a dielectric layer, a first patterned conductive layer, and a second patterned conductive layer. The first conductive base defines a first cavity. The first semiconductor die is on a bottom surface of the first cavity. The dielectric layer covers the first semiconductor die, the first surface and the second surface of the first conductive base and fills the first cavity. The first patterned conductive layer is on a first surface of the dielectric layer. The second patterned conductive layer is on a second surface of the dielectric layer.

20 Claims, 43 Drawing Sheets

SEMICONDUCTOR DEVICE PACKAGE

CROSS-REFERENCE TO RELATED APPLICATION

This application claims the benefit of and priority to U.S. Provisional Application No. 62/350,622, filed Jun. 15, 2016, the content of which is incorporated herein by reference in its entirety.

BACKGROUND

1. Technical Field

The present disclosure relates to a semiconductor device package and a method of manufacturing the same. In particular, the present disclosure relates to a semiconductor device package structure including an improved conductive base and a method for manufacturing the same.

2. Description of the Related Art

In some embedded semiconductor device packages, where one or more semiconductor devices are disposed in a die paddle of a leadframe, it can be challenging to integrate a large number of components and/or input/outputs (I/Os) (e.g. conductive lines/vias/traces) into the embedded semiconductor device package while preventing or mitigating parasitic capacitance.

SUMMARY

In one or more embodiments in accordance with a first aspect of the present disclosure, a semiconductor device package includes a first conductive base, a first semiconductor die, a dielectric layer, a first patterned conductive layer, a second patterned conductive layer, a plurality of first interconnection structures and a plurality of second interconnection structures. The first conductive base has a first surface and a second surface opposite to the first surface. A first cavity is defined by the first conductive base and formed in the first surface of the first conductive base. The first cavity has a bottom surface. The first semiconductor die is disposed on the bottom surface of the first cavity. The dielectric layer is disposed on the first semiconductor die, the first surface and the second surface of the first conductive base and fills the first cavity. The dielectric layer has a first surface and a second surface opposite to the first surface. The first patterned conductive layer is disposed on the first surface of the dielectric layer. The second patterned conductive layer is disposed on the second surface of the dielectric layer. The plurality of first interconnection structures are disposed in the dielectric layer and electrically connected to the first semiconductor die and the first patterned conductive layer. The plurality of second interconnection structures are disposed in the dielectric layer and electrically connected to the second surface of the first conductive base and the second patterned conductive layer.

In one or more embodiments in accordance with another aspect of the present disclosure, a semiconductor device package includes a conductive base, a first semiconductor die, a second semiconductor die, a dielectric layer, a first patterned conductive layer, a plurality of first interconnection structures and a plurality of second interconnection structures. The conductive base has a first surface and a second surface opposite to the first surface. The conductive base defines a cavity formed in the first surface of the first conductive base. The cavity has a bottom surface. The first semiconductor die is disposed on the bottom surface of the cavity. The second semiconductor die is disposed on the bottom surface of the cavity. The dielectric layer is disposed on the first surface of the conductive base, the first semiconductor die and the second semiconductor die and fills the cavity. The dielectric layer has a first surface. The first patterned conductive layer and a second patterned conductive layer are disposed on the first surface of the dielectric layer. The plurality of first interconnection structures are disposed in the dielectric layer and electrically connected to the first semiconductor die and the first patterned conductive layer. The plurality of second interconnection structures are disposed in the dielectric layer and electrically connected to the second semiconductor die and the second patterned conductive layer.

In one or more embodiments in accordance with another aspect of the present disclosure, a semiconductor device package includes a conductive base, a first semiconductor die, a first dielectric layer, a first patterned conductive layer, a second semiconductor die, a second dielectric layer and a second patterned conductive layer. The conductive base has a first surface and a second surface opposite to the first surface. The conductive base defines a cavity formed in the first surface of the conductive base. The cavity has a bottom surface. The first semiconductor die is disposed on the bottom surface of the cavity. The first dielectric layer is disposed on the first surface of the conductive base and the first semiconductor die. The first dielectric layer has a first surface. The first patterned conductive layer is disposed on the first dielectric layer and electrically connected to the first semiconductor die. The second semiconductor die is disposed on the first patterned conductive layer. The second dielectric layer is disposed on the first patterned conductive layer, the first surface of the first dielectric layer, and the second semiconductor die. The second patterned conductive layer is disposed on the second dielectric layer and electrically connected to the second semiconductor die.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are embodiments of techniques for providing devices with reduced package sizes. For example, the present disclosure describes embodiments of a semiconductor device package structure including an improved conductive base structure for mitigating or eliminating parasitic capacitance when one or more semiconductor devices are disposed in a die paddle of a leadframe.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1:
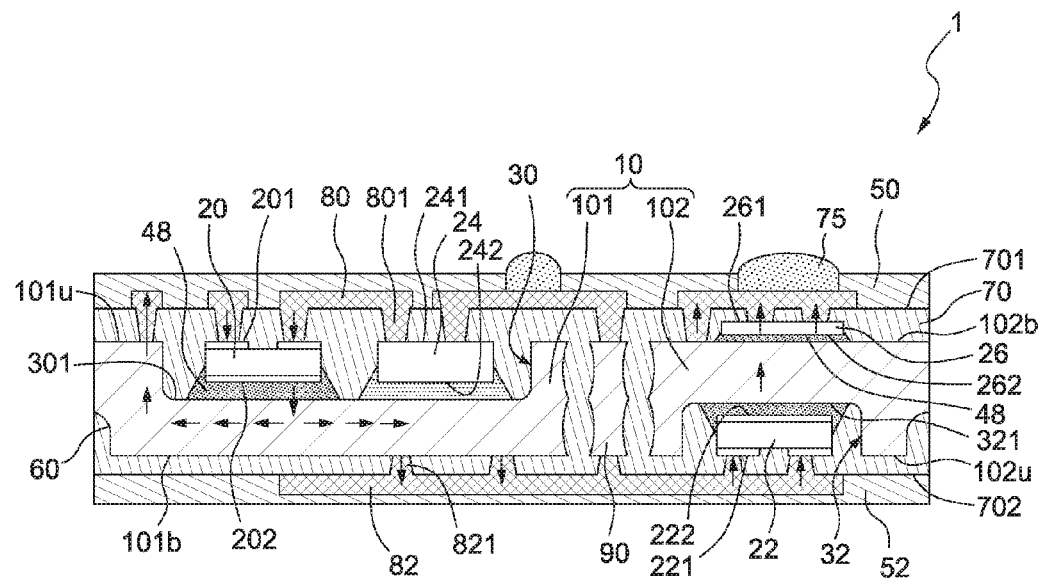
FIG. 1 is a cross-sectional view of some embodiments of a semiconductor device package in accordance with a first aspect of the present disclosure.

FIG. 1 is a cross-sectional view of some embodiments of a semiconductor device package 1 in accordance with a first aspect of the present disclosure. The semiconductor device package 1 includes a substrate 10, semiconductor dies 20, 22, 24 and 26, conductive adhesive layers 48, a protection layer 70 (e.g. a dielectric layer) that can, in at least some embodiments, function as a support layer, insulating layers 50 and 52, patterned conductive layers 80 and 82, interconnection structures 801 and 821, a connecting element 90, and conductive connects 75.

The substrate 10 includes a conductive base 101 and a conductive base 102. In some embodiments, the conductive bases 101 and 102 can constitute, or can be a part of, a leadframe. The conductive base 101 has a first surface 101u and a surface 101b opposite to the first surface 101u. The conductive base 102 has a first surface 102u and a surface 102b opposite to the first surface 102u. A material of the conductive bases 101 and 102 may include, for example, copper (Cu), or another metal, or a metal alloy, or other conductive material. In some embodiments, the conductive bases 101 and 102 can constitute, or can be a part of, a die paddle. Implementation of structure that is, at least in part, substantially symmetric including the conductive base 101 and the conductive base 102 can provide for reduced warpage of the semiconductor device package 1. In addition, a large number of components can be integrated into a leadframe having a substantially symmetrical structure. In some embodiments, by disposing the conductive base 101 and the conductive base 102 on opposite sides of a connecting element 90, each conductive base having a substantially same minimum distance from the connecting element 90, can provide for reduced warpage of the semiconductor device package 1, and for integration of a large number of components into a leadframe.

In some embodiments, the conductive bases 101 and 102 defines one or more curved structures 60 (e.g. smoothed or rounded corners) that can help to reduce or minimize stress at the respective curved structures 60 during a manufacturing operation (e.g. reduced stress relative to stresses involved in formation of the protection layer 70). The curved structures 60 may further help to redistribute stress across the conductive bases 101 and 102, to more evenly apportion stress across the conductive bases 101 and 102, or to transfer a stress point from one portion of the conductive bases 101 and 102 to another portion of the conductive bases 101 and 102. Different curved structures 60 may have different radii of curvature and/or may form different angles of taper with respect to the surface 101b of the conductive base 101 or the first surface 102u of the conductive base 102.

The conductive base 101 defines a cavity 30 in the first surface 101u of the conductive base 101, and the conductive base 102 defines a cavity 32 in the first surface 102u of the conductive base 102. The cavity 30 has a bottom surface 301 and the cavity 32 has an upper surface 321. A semiconductor die 20 and a semiconductor die 24 are disposed on the bottom surface 301 of the cavity 30. A semiconductor die 22 is disposed on the upper surface 321 of the cavity 32.

The cavities 30 and 32 are respectively formed in the conductive base 101 and the conductive base 102 and can receive the semiconductor dies 20, 22 and 24, which can help to decrease package thickness. Some embodiments of a compact three-dimensional (3-D) embedded package can be achieved by a design that includes the cavities 30 and 32.

In some embodiments, the semiconductor die 20 has a first surface 201 and a second surface 202 opposite the first surface 201. The surface 202 of the semiconductor die 20 is bonded to the bottom surface 301 of the cavity 30 through the conductive adhesive layer 48. The conductive adhesive layer 48 may be, for example, a conductive gel or epoxy film (epoxy mixed with a conductive material), or other conductive material. In some embodiments, the semiconductor die 24 has a first surface 241 and a second surface 242 opposite the first surface 241 and the semiconductor die 22 has a first surface 221 and a second surface 222 opposite the first surface 221. The semiconductor die 24 is also bonded to the bottom surface 301 of the cavity 30 through the conductive adhesive layer 48. The semiconductor die 26 has a first surface 261 and a second surface 262 opposite the first surface 261. The surface 262 of the semiconductor die 26 is bonded to the surface 102b of the conductive base 102 through the conductive adhesive layer 48.

The semiconductor die 24 is bonded to the bottom surface 301 of the cavity 30 through the conductive adhesive layer 48 and the semiconductor die 22 is bonded to the upper surface 321 of the cavity 32 through the conductive adhesive layer 48. The semiconductor dies 20 and 22 may be, for example, power dice, and the semiconductor die 24 may be, for example, a control die. The die 26 is disposed on the surface 102b of the conductive base 102. The die 26 is electrically connected to the patterned conductive layer 80 through the interconnection structure 801.

The conductive adhesive layer 48 is disposed between the surface 202 of the semiconductor die 20 and the bottom surface 301 of the cavity 30. In some embodiments, the conductive adhesive layer 48 covers a portion of the bottom surface 301 of the cavity 30, and/or covers substantially the entire bottom surface 301. In some embodiments, the conductive adhesive layer 48 may contact a portion of one or more sidewalls of the semiconductor die 20. The conductive adhesive layer 48 attaches the semiconductor die 20 to the conductive base 101. The arrangement of the semiconductor die 24 is similar to the semiconductor die 20 (e.g. the semiconductor die 24 is similarly attached to the bottom surface 301 via conductive adhesive).

For the semiconductor die 22, the conductive adhesive layer 48 is disposed between the surface 222 of the semiconductor die 22 and the upper surface 321 of the cavity 32. In some embodiments, the conductive adhesive layer 48 covers a portion of the upper surface 321 of the cavity 32 and/or covers substantially the entire upper surface 321. In some embodiments, the conductive adhesive layer 48 may contact a portion of one or more sidewalls of the semiconductor die 22. The conductive adhesive layer 48 attaches the semiconductor die 22 to the conductive base 102.

The protection layer 70 is disposed on the conductive bases 101 and 102 and is disposed on the semiconductor dies 20, 22 and 24. The protection layer 70 has a first surface 701 and a second surface 702 opposite to the first surface 701. The protection layer 70 encapsulates the first surface 101u and the second surface 101b of the conductive base 101 and encapsulates at least a portion of the semiconductor dies 20 and 24. The protection layer 70 also encapsulates and/or covers at least a portion of the first surface 102u and the surface 102b of the conductive base 102 and encapsulates at least a portion of the semiconductor die 22. In some embodiments, a material of the protection layer 70 may include a polypropylene resin; however, other suitable materials may be additionally or alternatively used.

The interconnection structures 801 respectively electrically connect respective patterned conductive layers 80 to the first surface 201 of the semiconductor die 20 and to the first surface 241 of the semiconductor die 24. The interconnection structure 821 electrically connects the patterned conductive layer 82 to the first surface 221 of the semiconductor die 22. The interconnection structure 801 is electrically connected to the first surface 101u of the conductive base 101 and the interconnection structure 821 is electrically connected to the first surface 102u of the conductive base 102. The surface 102b of the conductive base 102 is electrically connected to the patterned conductive layer 80 through the plurality of interconnection structures 801. The semiconductor die 22 is electrically connected to the conductive layer 82 through the plurality of interconnection structures 821. In some embodiments, the die 20 is electrically connected to the die 22 through the conductive base 101 and the interconnection structures 821.

In some embodiments, the interconnection structures 801 and 821 are conductive vias formed through the protection layer 70. A material of interconnection structures 801 and 821 and patterned conductive layer 80 and 82 may include, for example, copper or another metal, or a metal alloy, or other conductive material.

The insulating layer 50 is disposed on at least a portion of the first surface 701 of the protection layer 70 and over the interconnection structures 801. The insulating layer 52 is disposed on at least a portion of the second surface 702 of the protection layer 70 and over the interconnection structures 821. In some embodiments, the insulating layers 50 and 52 may include a solder mask. A material of one or both of the insulating layers 50 and 52 may include a polypropylene resin and/or other insulating materials. Conductive connects 75 (e.g., solder balls) are disposed on the patterned conductive layers 80.

The conductive base 101 defines curved structures 60 and the conductive base 102 defines curved structures 60. The curved structures 60 can include rounded corners of the conductive bases. The curved structures 60 can include recesses defined by one or more of the conductive bases (e.g. recesses formed in an outer sidewall or other sidewall of one or more of the conductive bases), and the recesses can include a rounded corner. The recesses can be defined by a bottom portion of a sidewall of a conductive base (e.g. can extend to a corner where the sidewall and the surface 101b or the surface 102u connect). In another embodiment, the curved structures 60 of conductive base 101 and conductive base 102 may be filled with protection layer 70. The curved structures can help to reduce or prevent damage to the protection layer 70 during separation (e.g. singulation) of individual semiconductor device packages 1 from a larger package (e.g., from a panel).

The connecting element 90 is disposed in the protection layer 70. The connecting element 90 is electrically connected to at least one of the patterned conductive layer 80 and the patterned conductive layer 82 (e.g. through one of the interconnection structures 801 or 821). The material of the connecting element 90 may include, for example, copper or another metal, or a metal alloy, or other conductive material. In some embodiments, the connecting element 90 is a metal component (e.g., a metal frame) or a through hole filled with a conductive material.

One example current path (indicated by arrows in FIG. 1) in the semiconductor device package 1 flows from the patterned conductive layer 80 through the conductive base 101 to the patterned conductive layer 82. By providing for such a path, one or more vias of reduced height can be implemented (as compared to, for example, a via extending from the top patterned conductive layer 80 to the bottom patterned conductive layer 82). It can be easier to manufacture such a relatively short via. Such a reduction of the conductive/current path can also help to avoid signal attenuation or interference.

Figure 2A:
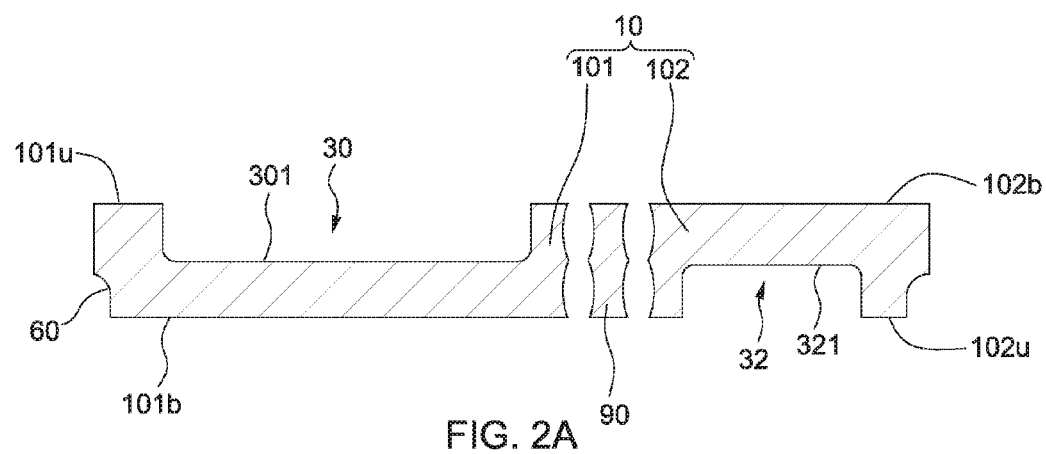
FIG. 2A, FIG. 2B, FIG. 2C, FIG. 2D, FIG. 2E, FIG. 2F, FIG. 2G and FIG. 2H illustrate some embodiments of a method of manufacturing the semiconductor device package depicted in FIG. 1.

FIGS. 2A-2H illustrate some embodiments of a method of manufacturing the semiconductor device package 1 depicted in FIG. 1. Referring to FIG. 2A, conductive bases 101 and 102 are provided. The conductive base 101 has a first surface 101u and a surface 101b opposite to the first surface 101u. The conductive base 102 has a first surface 102u and a surface 102b opposite to the first surface 102u. The material of the conductive bases 101 and 102 include, for example, copper or another metal, or a metal alloy, or other conductive material. The connecting element 90 is formed, for example, by drilling (e.g. by drilling at least two holes into an initial conductive base, thereby forming the separate conductive bases 101 and 102 and the connecting element 90). The first surface 101u defines the cavity 30 (e.g. the first surface 101u is provided with the cavity 30, or the cavity 30 is formed in the first surface 101u). The first surface 102u defines the cavity 32 (e.g. the first surface 102u is provided with the cavity 32, or the cavity 32 is formed in the first surface 102u). The cavity 30 has bottom surface 301. The cavity 32 has an upper surface 321. In some embodiments, the conductive base 101 is provided with the cavity 30 and is not etched to form the cavity 30 (e.g. is not etched subsequent to the above-described provision of the conductive base 101). That is, the first surface 101u of the conductive base 101 is not removed by an etching technique. The unetched structure of the conductive base 101, which may provide a relatively robust or strong structure, is relatively easier to be handled to facilitate subsequent electrical measurements/tests. The conductive base 101 defines one or more curved structures 60. Curved structures 60 of the conductive base 101 are smoothed and can help to redistribute stress to avoid damage to the protection layer 70 during lamination. The structure of the conductive base 102 may be formed in a similar manner.

Figure 2B:
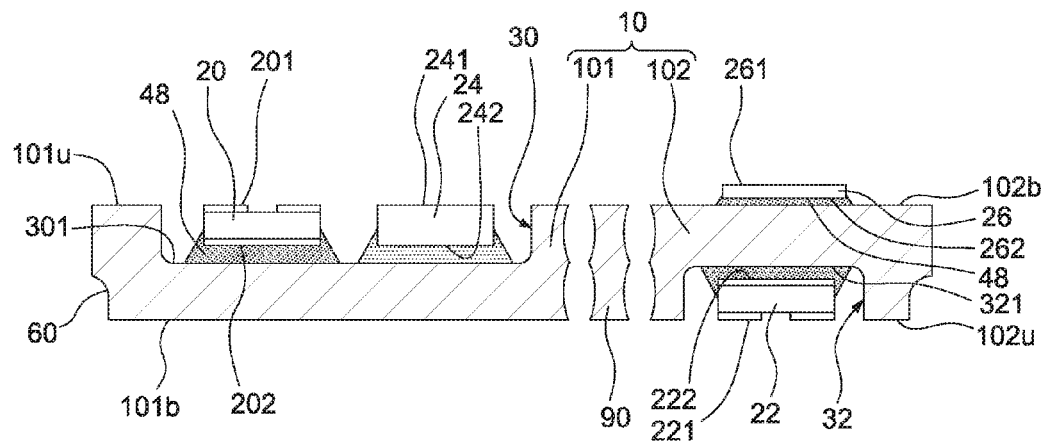

Referring to FIG. 2B, conductive adhesive layers 48 are disposed on the bottom surface 301 of the cavity 30 and on the upper surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 is used to attach the semiconductor die 20 to the bottom surface 301 of the cavity 30. The semiconductor dies 22, 24 and 26 may be disposed in a similar manner.

Figure 2C:
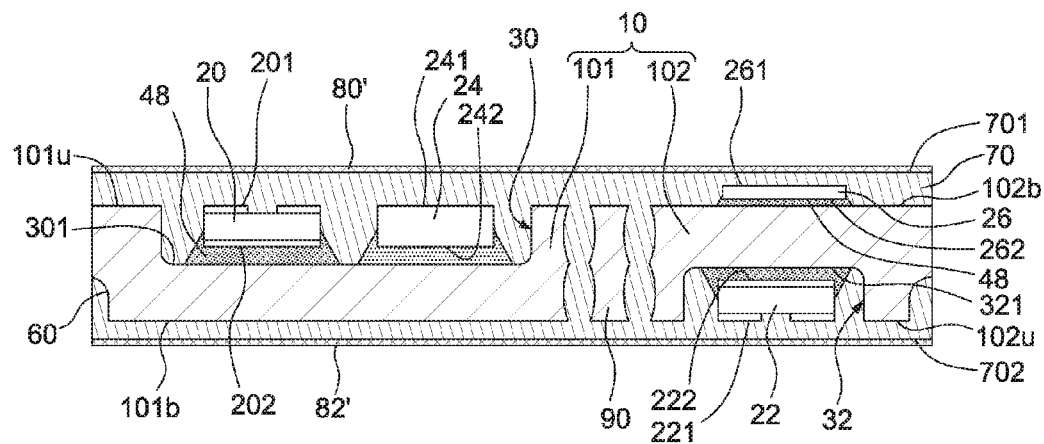

Referring to FIG. 2C, a protection layer 70 is formed on the conductive bases 101 and 102 and the semiconductor dies 20, 22, 24 and 26 by, for example, a lamination technique. The protection layer 70 also covers or fills in the curved structures 60. A material of the protection layer 70 may include, for example, a polypropylene resin or other suitable material. A portion of the protection layer 70 is melted during lamination. A conductive layer 80' is disposed on the first surface 701 of the protection layer 70 by coating, sputtering, plating or another suitable technique. A conductive layer 82' is disposed on the second surface 702 of the protection layer 70 by coating, sputtering, plating or another suitable technique. The conductive layers 80' and 82' may include, for example, aluminum or copper, or an alloy thereof (such as AlCu).

Figure 2D:
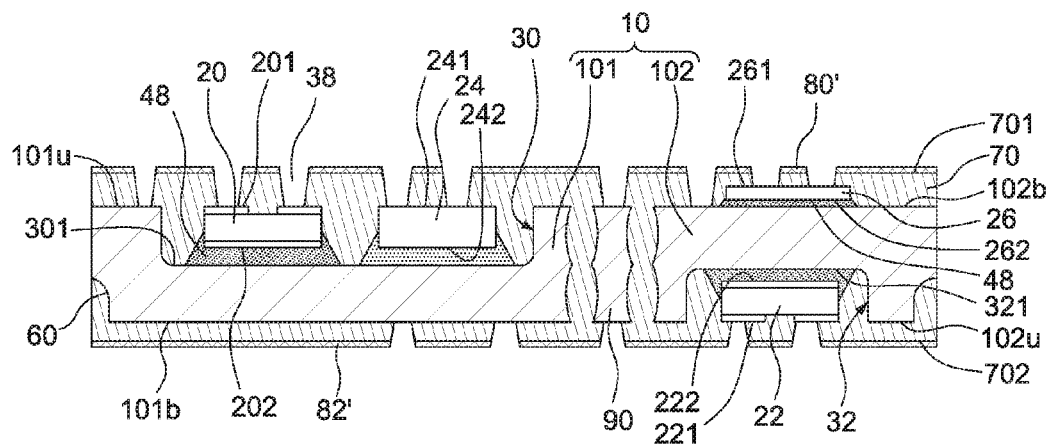

Referring to FIG. 2D, vias 38 are formed through the protection later 70 from the surface of the conductive layer 80' and vias 39 are formed through the protection later 70 from the surface of the conductive layer 82'. The vias 38 and 39 may be formed, for example, by drilling.

Figure 2E:
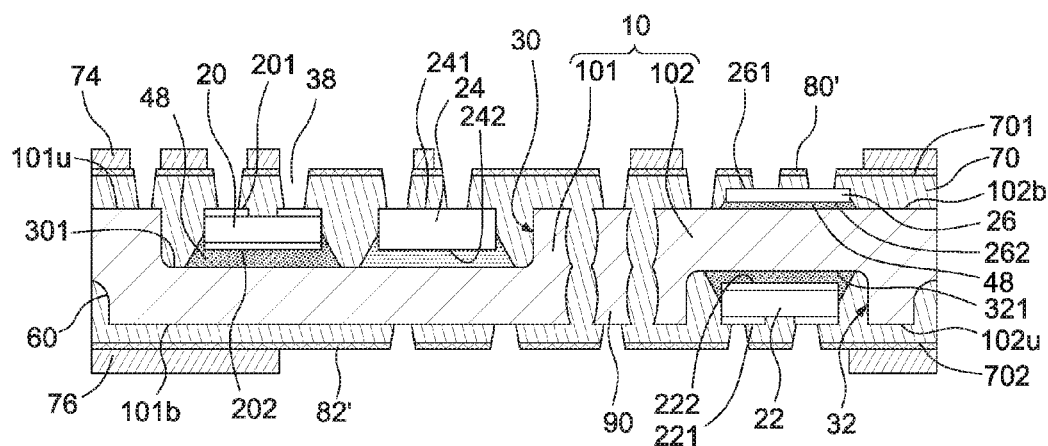

Referring to FIG. 2E, a patterned photoresist layer 74 is disposed on the conductive layer 80' and a patterned photoresist layer 76 is disposed on the conductive layer 82'. The patterned photoresist layers 74 and 76 may be formed by coating or another suitable technique. The patterned photoresist layers 74 and 76 may include a positive photoresist or other suitable material.

Figure 2F:
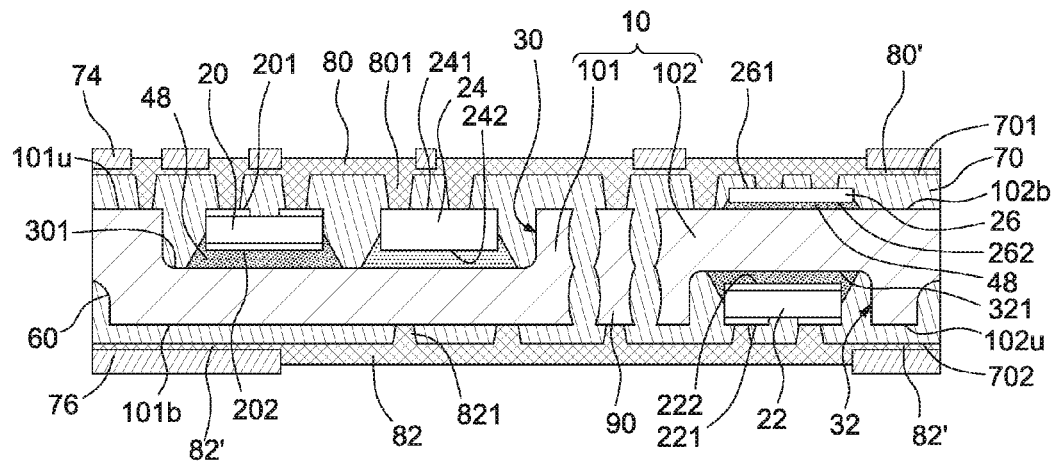

Referring to FIG. 2F, the thickness of conductive layers 80' and 82' are increased by coating, sputtering, plating or another suitable technique. The conductive layers 80 and 82 and the interconnection structures 801 and 821 are formed by, for example, such plating.

Figure 2G:
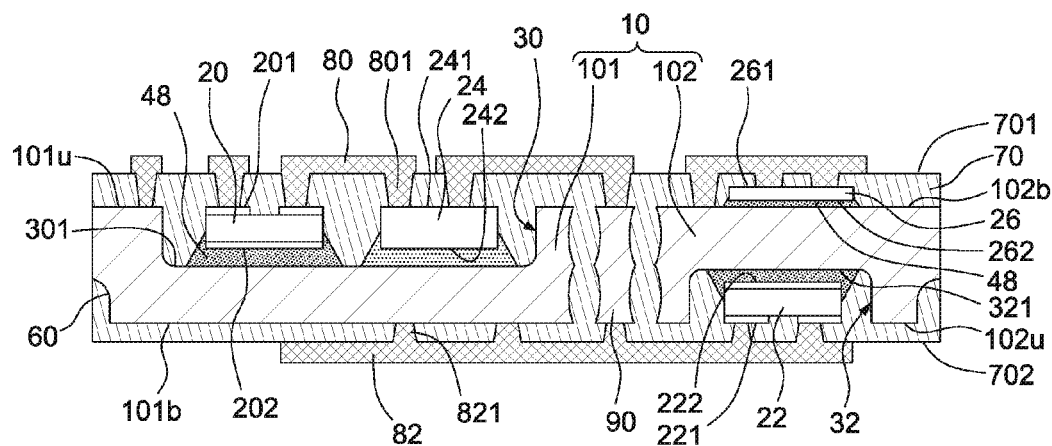

Referring to FIG. 2G, the patterned photoresist layers 74 and 76 are removed by a suitable technique, such as an etching process. After etching, a portion of the first surface 701 of the protection layer 70 is exposed and a portion of the second surface 702 of the protection layer 70 is exposed.

Figure 2H:
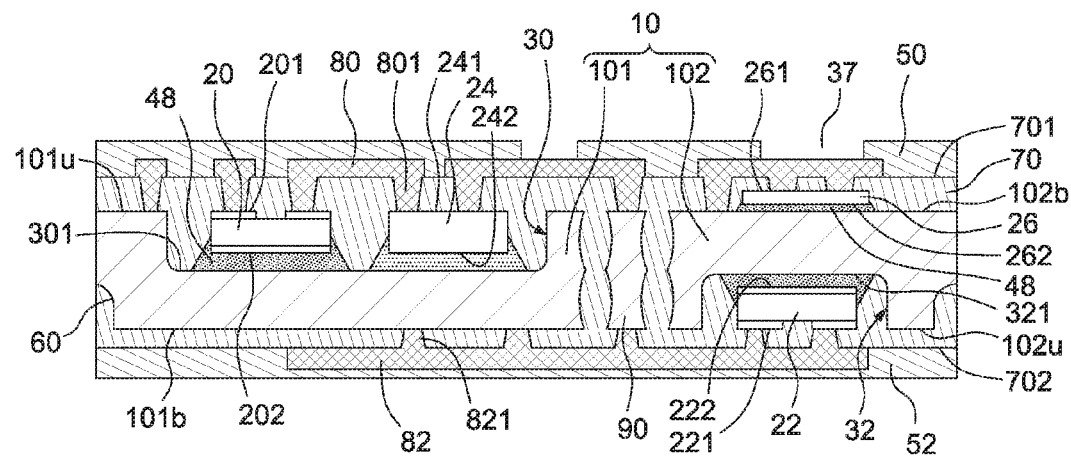

Referring to FIG. 2H, an insulating layer 50 is disposed on the first surface 701 of the protection layer 70 and an insulating layer 52 is disposed on the second surface 702 of the protection layer 70. The insulating layer 50 covers at least a portion of the patterned conductive layers 80 and the insulating layer 52 covers at least a portion of the patterned conductive layers 82. A material of one or both of the insulating layers 50 and 52 may include a polypropylene resin or other insulating materials used additionally or alternatively. Next, the conductive connects 75 are disposed on, or formed on, vias 37 defined by the insulating layer 50 to form the semiconductor device package 1 as illustrated in FIG. 1. The conductive connects 75 may include, for example, one or more solder balls. The vias 37 are disposed over the patterned conductive layers 80.

Figure 3A:
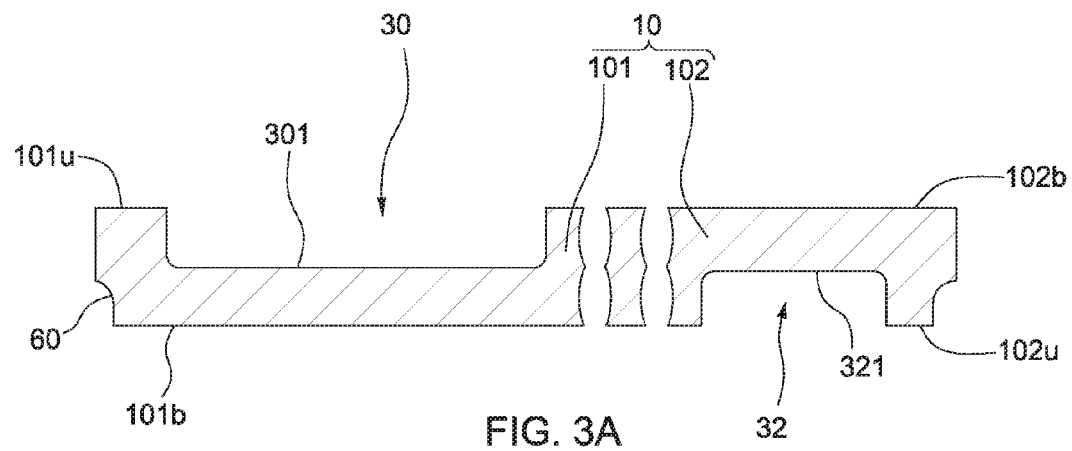
FIG. 3A, FIG. 3B, FIG. 3C, FIG. 3D, FIG. 3E, FIG. 3F, FIG. 3G, FIG. 3H, FIG. 3I, and FIG. 3J illustrate some embodiments of a method of manufacturing the semiconductor device package depicted in FIG. 1.

FIGS. 3A-3J illustrate some embodiments of a method of manufacturing the semiconductor device package 1 depicted in FIG. 1. Referring to FIG. 3A, conductive bases 101 and 102 are provided. The conductive base 101 has a first surface 101u and a surface 101b opposite to the first surface 101u. The conductive base 102 has a first surface 102u and a surface 102b opposite to the first surface 102u. The material of the conductive bases 101 and 102 include, for example, copper or another metal, or a metal alloy, or other conductive material. The connecting element 90 is formed, for example, by drilling (e.g. by drilling at least two holes into an initial conductive base, thereby forming the separate conductive bases 101 and 102 and the connecting element 90). The first surface 101u defines the cavity 30 (e.g. the first surface 101u is provided with the cavity 30, or the cavity 30 is formed in the first surface 101u). The first surface 102u defines the cavity 32 (e.g. the first surface 102u is provided with the cavity 32, or the cavity 32 is formed in the first surface 102u). The conductive bases 101 and 102 define one or more curved structures 60.

Figure 3B:
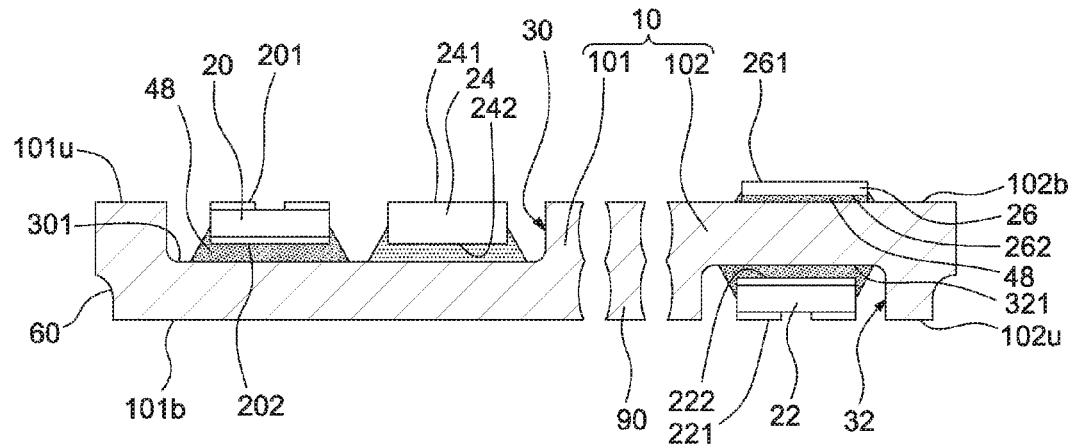

Referring to FIG. 3B, conductive adhesive layers 48 are disposed on the bottom surface 301 of the cavity 30 and on the upper surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 is used to attach the semiconductor die 20 to the bottom surface 301 of the cavity 30. The semiconductor dies 22, 24 and 26 may be disposed in a similar manner.

Figure 3C:
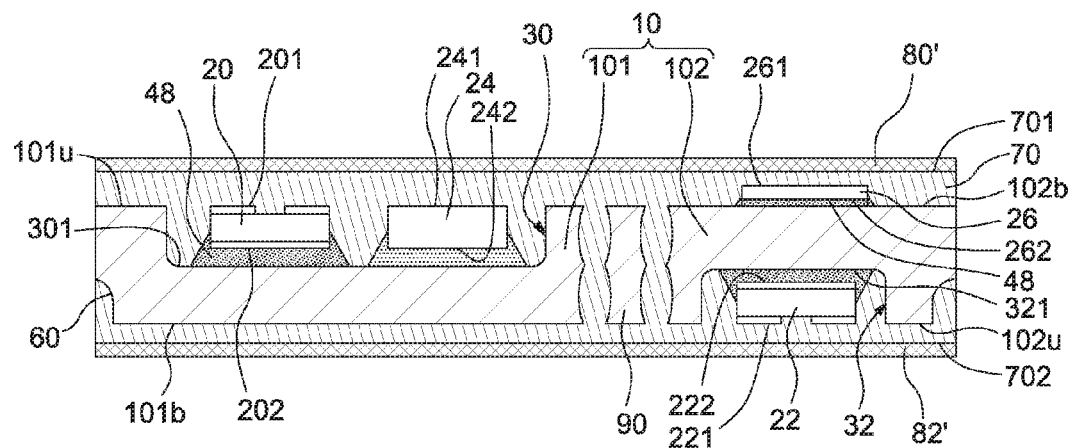

Referring to FIG. 3C, a protection layer 70 is formed on the conductive bases 101 and 102 and the semiconductor dies 20, 22, 24 and 26 by, for example, a lamination technique. The protection layer 70 also covers or fills in the curved structures 60. A material of the protection layer 70 may include, for example, a polypropylene resin or other suitable material. A portion of the protection layer 70 is melted during lamination. A conductive layer 80' is disposed on the first surface 701 of the protection layer 70 by coating, sputtering, plating or another suitable technique. A conductive layer 82' is disposed on the second surface 702 of the protection layer 70 by coating, sputtering, plating or another suitable technique.

Figure 3D:
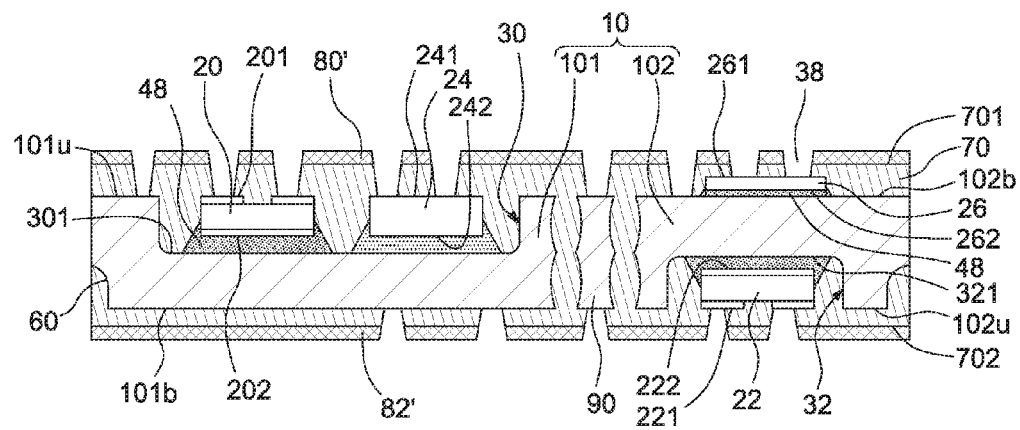

Referring to FIG. 3D, vias 38 are formed through the protection later 70 from the surface of the conductive layer 80' and vias 39 are formed through the protection later 70 from the surface of the conductive layer 82'. The vias 38 and 39 may be formed, for example, by drilling.

Figure 3E:
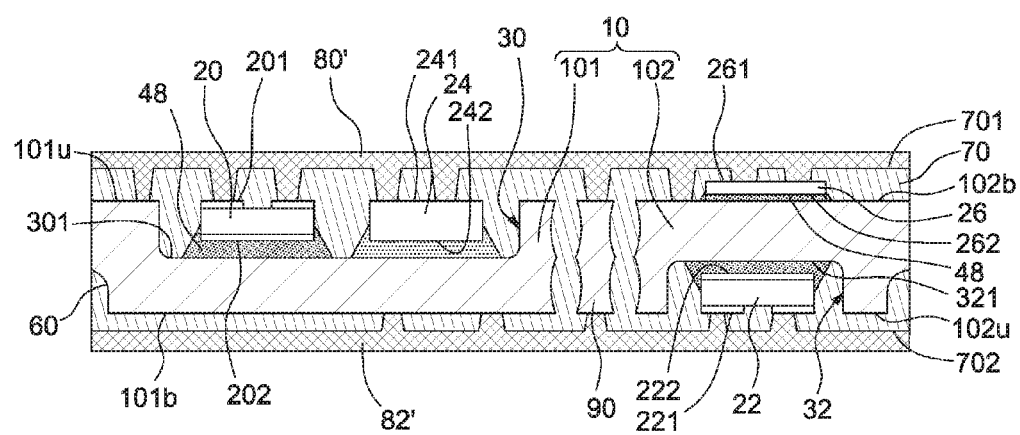
Figure 3F:
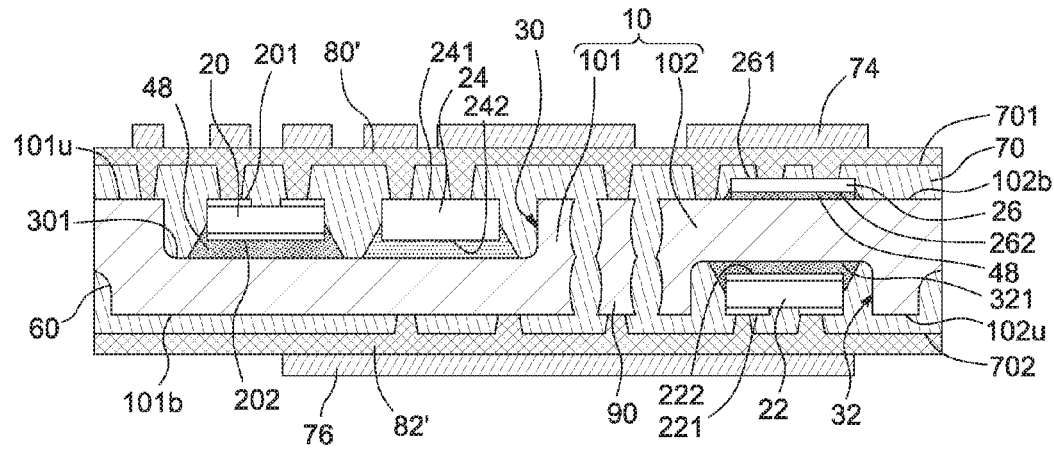

Referring to FIG. 3E, the conductive layers 80' and 82' are formed and fill the vias 38. The conductive layers 80' and 82' are formed by coating, sputtering, plating or another suitable technique. Referring to FIG. 3F, a patterned photoresist layer 74 is disposed on the conductive layer 80' and a patterned photoresist layer 76 is disposed on the conductive layers 82'. The patterned photoresist layers 74 and 76 may be formed by coating or another suitable technique. The patterned photoresist layers 74 and 76 may include a positive photoresist or other suitable material.

Figure 3G:
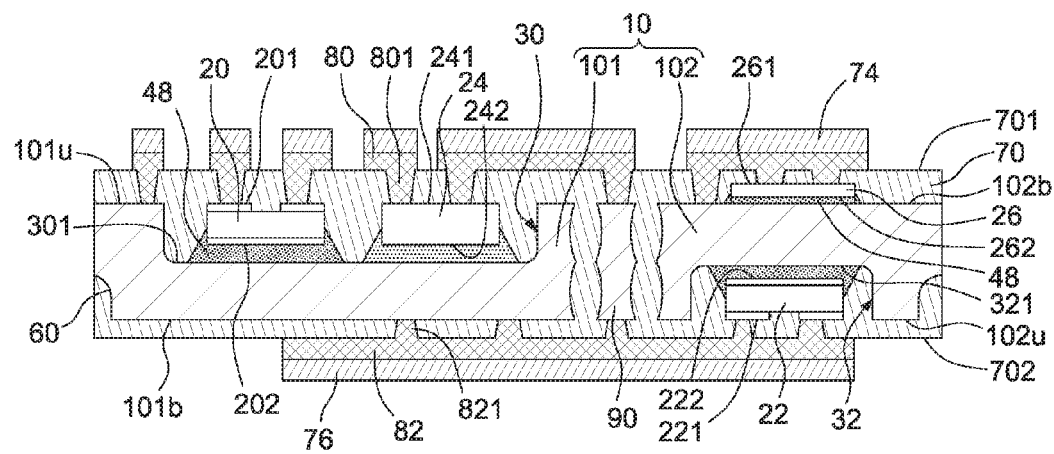

Referring to FIG. 3G, a portion of the conductive layer 80' which is not covered by the patterned photoresist layer 74 is removed by, for example, etching or drilling. A portion of the conductive layer 82' which is not covered by the patterned photoresist layer 76 is removed by, for example, etching or drilling. After etching, the formation of the patterned conductive layers 80 and 82, and the interconnection structures 801 and 821 is completed.

Figure 3H:
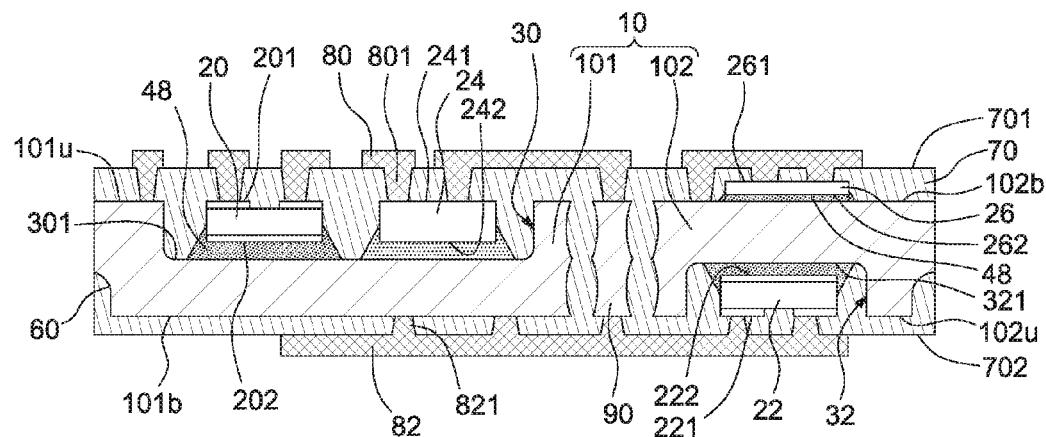

Referring to FIG. 3H, the patterned photoresist layers 74 and 76 are removed by a suitable technique, such as an etching process. After etching, a portion of the first surface 701 of the protection layer 70 is exposed and a portion of the second surface 702 of the protection layer 70 is exposed.

Figure 3I:
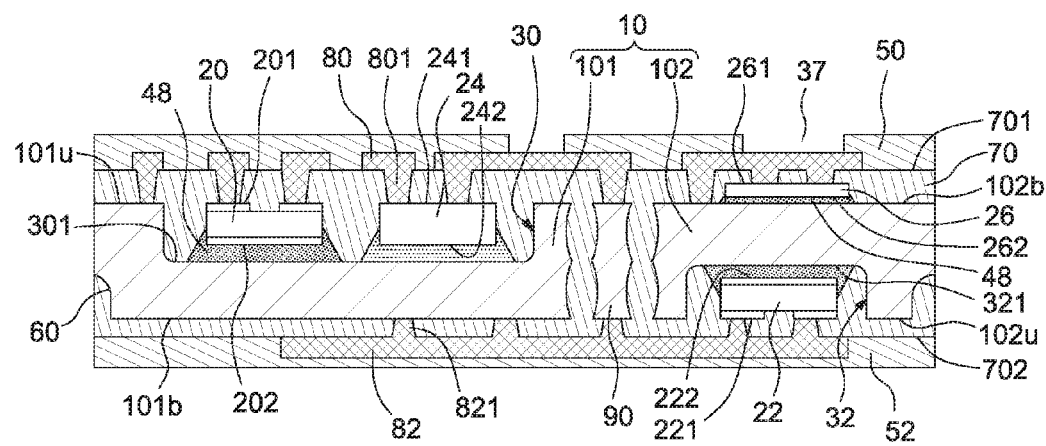
Figure 3J:
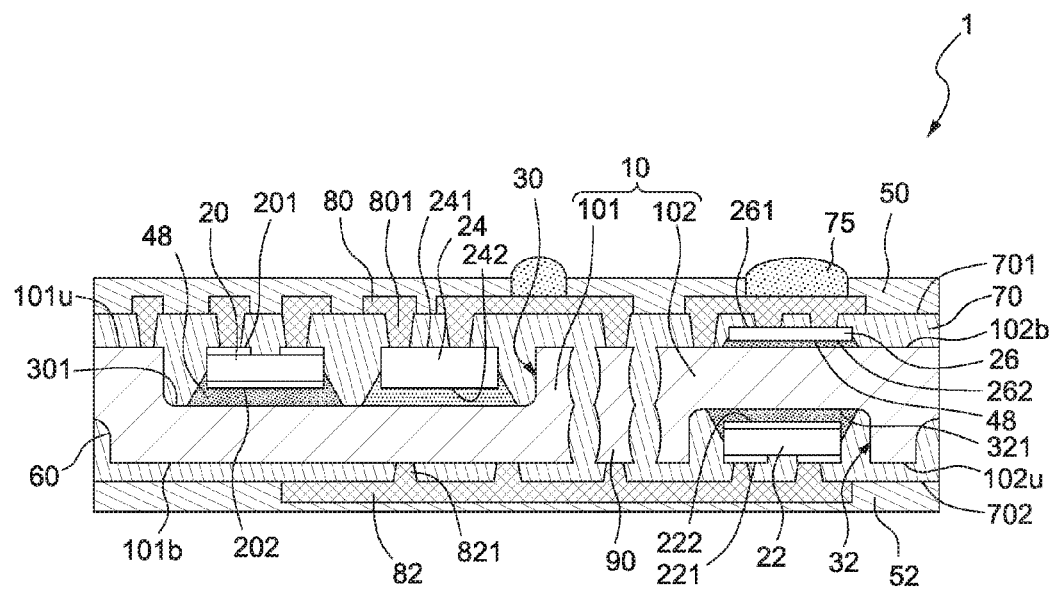

Referring to FIG. 3I, an insulating layer 50 is disposed on at least a portion of the first surface 701 of the protection layer 70 and an insulating layer 52 is disposed on at least a portion of the second surface 702 of the protection layer 70. The insulating layer 50 covers at least a portion of the patterned conductive layers 80 and the insulating layer 52 covers at least a portion of the patterned conductive layers 82. A material of one or both of the insulating layers 50 and 52 may include a polypropylene resin and/or other insulating materials. Referring to FIG. 3J, the conductive connects 75 are disposed in, or formed in the vias 37 to form the semiconductor device package 1 as illustrated in FIG. 1. The conductive connects 75 may include one or more solder balls.

Figure 4A:
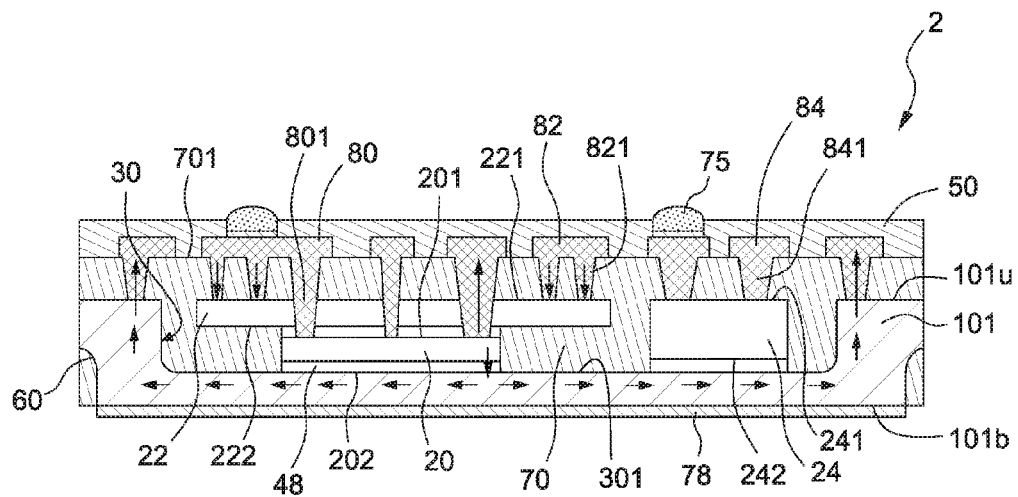
FIG. 4A is a cross-sectional view of some embodiments of a semiconductor device package in accordance with a second aspect of the present disclosure.

FIG. 4A is a cross-sectional view of some embodiments of a semiconductor device package 2 in accordance with a second aspect of the present disclosure. The semiconductor device package 2 is similar in some ways to the semiconductor device package 1 depicted in FIG. 1, and some same-numbered components are not described again with respect to FIG. 4A. In the semiconductor device package 2, the conductive base 101 is included, while omitting an additional conductive base. A material of the conductive base 101 includes, for example, copper or another metal, or a metal alloy, or other conductive material. The semiconductor device package 2 includes a surface finish layer 78 on the surface 101b of the conductive base 101. The surface finish layer 78 may include any suitable conductive material (such as including, for example, nickel (Ni), palladium (Pd), gold (Au), silver (Ag), Cu, and combinations of metals).

The conductive base 101 defines a cavity 30 in the first surface 101u of the conductive base 101. The cavity 30 has a bottom surface 301. The semiconductor die 20 has an active surface 201 electrically connected to the patterned conductive layer 80 and a surface 202 disposed on the bottom surface 301 of the cavity 30. The semiconductor die 22 has an active surface 221 electrically connected to the patterned conductive layer 82 and a surface 222 disposed on the active surface 201 of the semiconductor die 20. The semiconductor die 20 is disposed on the bottom surface 301 of the cavity 30 and the semiconductor die 22 is disposed on the active surface 201 of the semiconductor die 20.

The semiconductor die 24 has an active surface 241 electrically connected to the patterned conductive layer 84 and a surface 242 on the bottom surface 301 of the cavity 30. The semiconductor die 24 is disposed on the bottom surface 301 of the cavity 30. At least one of the semiconductor dies 20, 22 and 24 may be a power die, and at least one of the semiconductor die 20, 22 and 24 may be a control die. The first surface 101u of the conductive base 101 is electrically connected to the active surface 201 of the semiconductor die 20 and the active surface 221 of the stacked semiconductor die 22 through the interconnection structures 801 and 821. The stacked die structure provides for integrating a large number of components in the leadframe and a low area (e.g. surface area) of the leadframe. The active surface 201 of the semiconductor die 20 is substantially coplanar with the surface 222 of the semiconductor die 22. The active surface 201 of the semiconductor die 20 extends along the side of the surface 222 of the semiconductor die 22.

The protection layer 70 has a surface 701. The patterned conductive layer 80 and the patterned conductive layer 82 are formed on the surface 701 of the protection layer 70. The protection layer 70 covers at least a portion of the surface 101u of the conductive base 101 and the semiconductor dies 20, 22 and 24 and fills, at least in part, the cavity 30. The interconnection structures 801 in the protection layer 70 are electrically connected to the semiconductor die 20 and the patterned conductive layer 80. The interconnection structures 821 in the protection layer 70 are electrically connected to the semiconductor die 22 and the patterned conductive layer 82. The interconnection structures 841 in the protection layer 70 are electrically connected to the semiconductor die 24 and the patterned conductive layer 84. The interconnection structures 841 are electrically connected to the surface 101u of the conductive base 101 and one of the patterned conductive layers 80 and the patterned conductive layers 82.

Figure 4B:
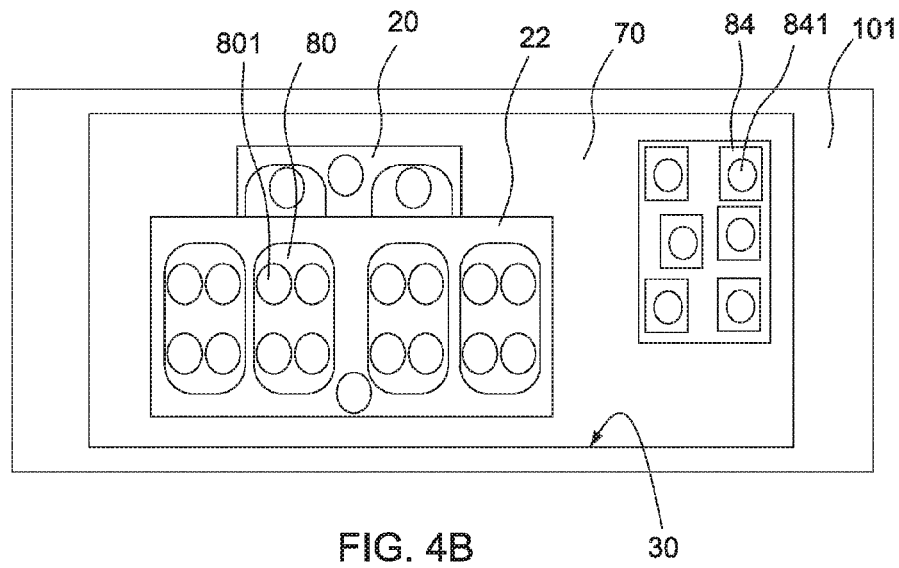
FIG. 4B illustrates a top view of some embodiments of the semiconductor device package depicted in FIG. 4A.

FIG. 4B illustrates a top view of some embodiments of the semiconductor device package 2 depicted in FIG. 4A. In FIG. 4B, the semiconductor die 20 and the semiconductor die 22 are at least slightly laterally offset and do not perfectly overlap (e.g. corresponding sides or surfaces of the semiconductor die 20 and the semiconductor die 22 do not align). A current output by the semiconductor die 20 may be transferred to the conductive base 101 through the conductive adhesive layer 48 and transferred to the interconnection structures 801 through the patterned conductive layers 80. A current output by the semiconductor die 22 may be transferred to the conductive base 101 through the semiconductor die 20 and the conductive adhesive layer 48 and transferred to the interconnection structures 821 through the patterned conductive layers 82. The offset of the semiconductor dies 20 and 22 may be implemented as desired (e.g. may be made large or small).

Figure 5A:
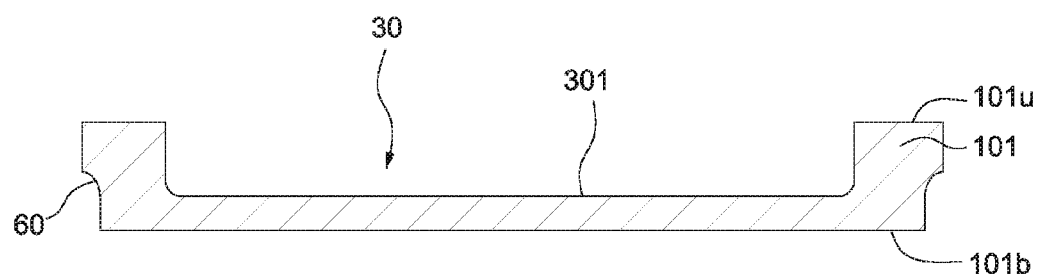
FIG. 5A, FIG. 5B, FIG. 5C, FIG. 5D, FIG. 5E, FIG. 5F, FIG. 5G, FIG. 5H, and FIG. 5I illustrate some embodiments of a method of manufacturing the semiconductor device package depicted in FIG. 4A.

FIGS. 5A-5I illustrate some embodiments of a method of manufacturing the semiconductor device package 2 depicted FIG. 4A. Referring to FIG. 5A, a conductive base 101 is provided. The conductive base 101 has a first surface 101u and a surface 101b opposite to the first surface 101u. The material of the conductive base 101 is, for example, copper or another metal, or a metal alloy, or other conductive material. The conductive base 101 defines a cavity 30 in the first surface 101u of the conductive base 101. The cavity 30 has a bottom surface 301.

Figure 5B:
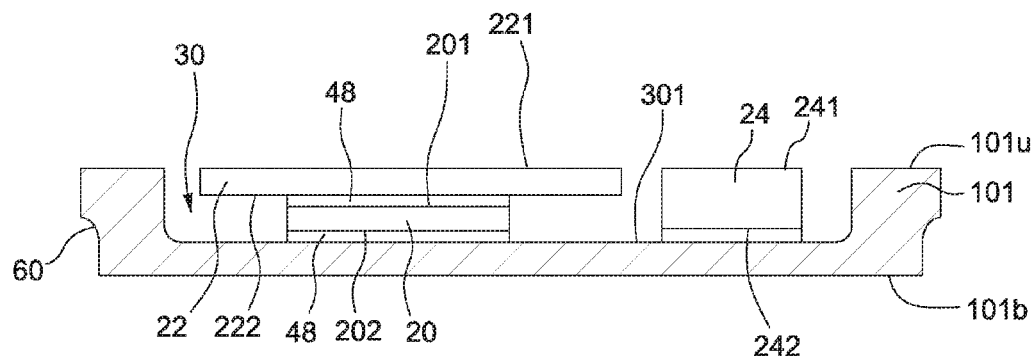

Referring to FIG. 5B, conductive adhesive layers 48 is disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 on the bottom surface 301 of the cavity 30. The conductive adhesive 48 is used to attach the semiconductor die 20 to the bottom surface 301 of the cavity 30. The semiconductor die 20 has an active surface 201 and a second surface 202 opposite the first surface 201.

A semiconductor die 22 has an active surface 221 and a second surface 222 opposite the first surface 221. The semiconductor die 22 is stacked on the active surface 201 of the semiconductor die 20 through a conductive adhesive layer 48. The semiconductor die 24 has an active surface 241 and a second surface 242 opposite the first surface 241. The semiconductor die 24 is disposed on the conductive adhesive layer 48 on the bottom surface 301 of the cavity 30.

Figure 5C:
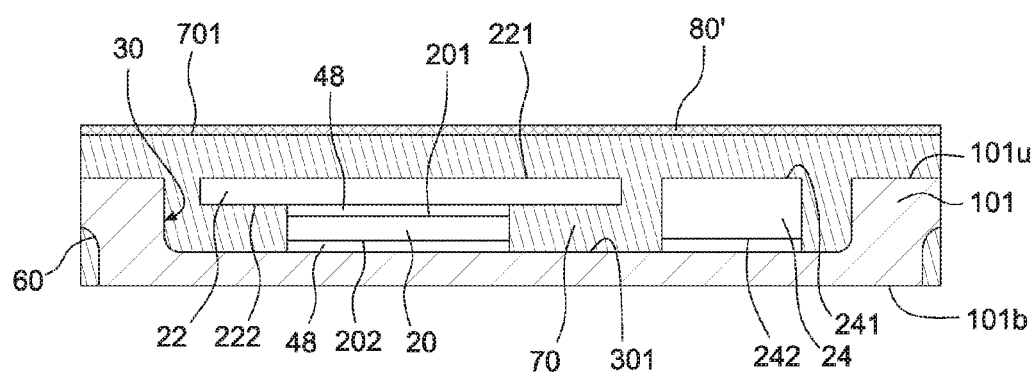

Referring to FIG. 5C, a protection layer 70 is disposed on the semiconductor dies 20, 22 and 24 and fills, at least in part, the cavity 30. The protection layer 70 has a surface 701. In some embodiments, the material of the protection layer 70 may include a polypropylene resin; however, other suitable materials may be additionally or alternatively used. The conductive layer 80' is disposed on the surface 701 of the protection layer 70. A material of conductive layer 80' may include, for example, copper or another metal, or a metal alloy, or other conductive material.

Figure 5D:
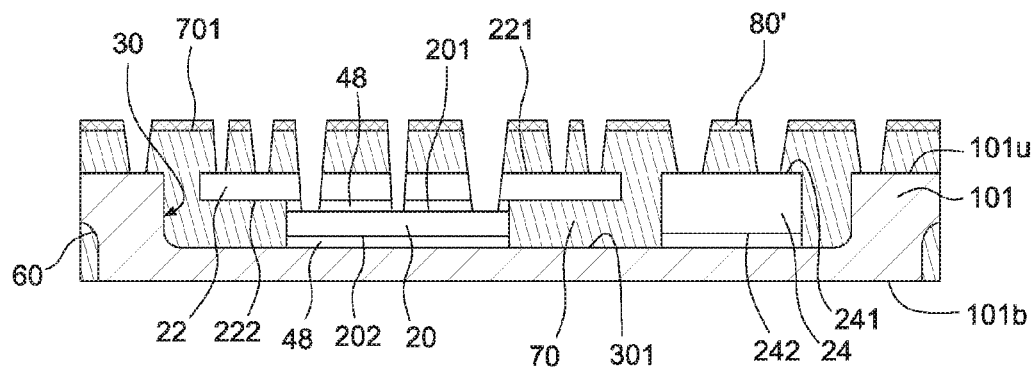

Referring to FIG. 5D, vias 38 are formed through the protection later 70 from the surface of the patterned conductive layer 80'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 5E:
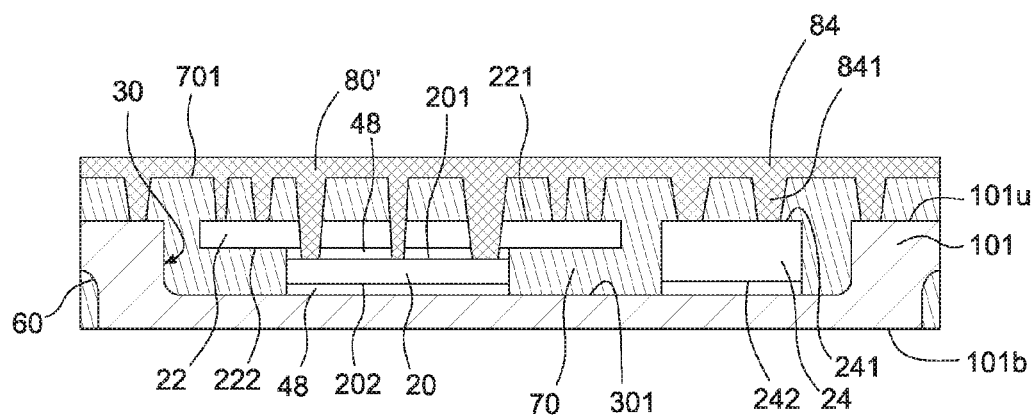

Referring to FIG. 5E, the vias 38 are filled with the conductive material 84, which is similar to or the same as the material of the conductive layer 80'. The thickness of conductive layer 80' is increased by coating, sputtering, plating or another suitable technique.

Figure 5F:
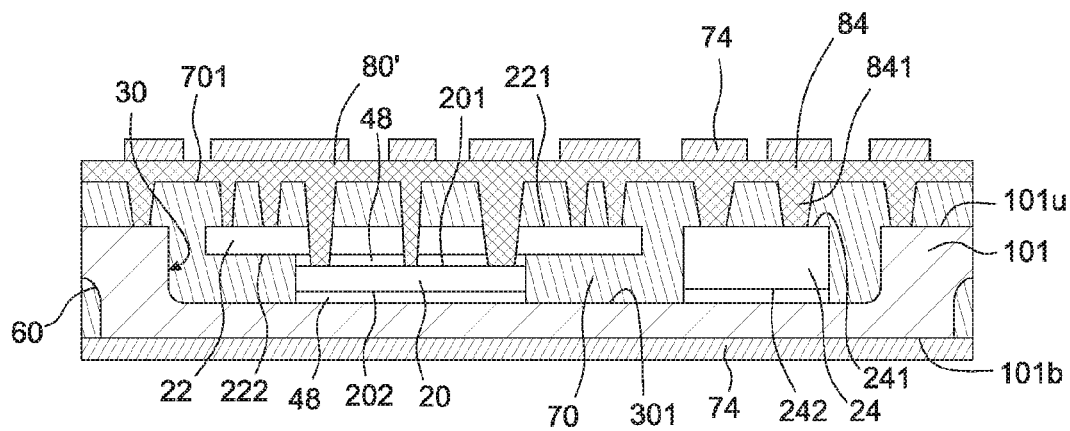

Referring to FIG. 5F, a patterned photoresist layer 74 is disposed on the conductive layers 80', the surface 101b of the conductive base 101 and the bottom surface of a portion of the protection layer 70 that fills in the curved structure 60. The patterned photoresist layer 74 may include a positive photoresist or other suitable material.

Figure 5G:
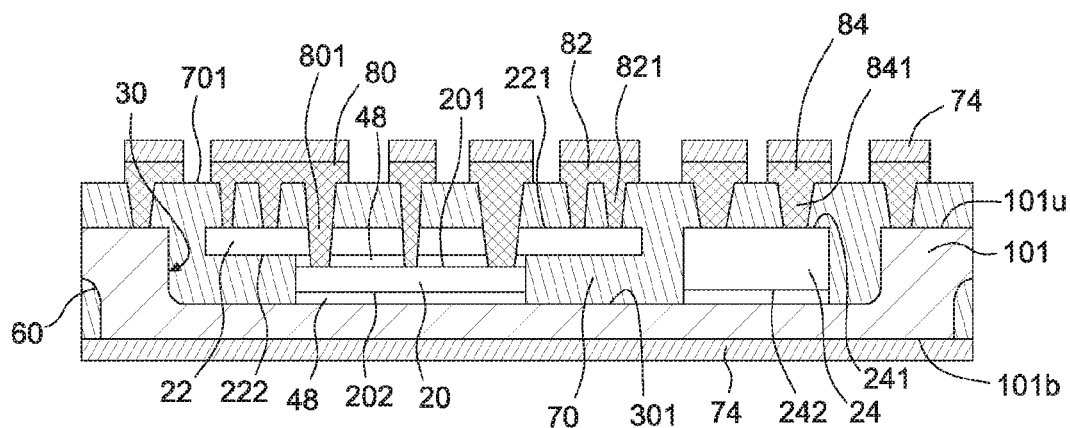

Referring to FIG. 5G, vias 36 are formed through the protection later 70 from the surface of the conductive layer 80'. After the vias 36 are formed, the conductive layers 80 and 82 and the interconnection structures 801 and 802 are formed. The material of interconnection structures 801 and 802 and conductive layers 80 and 82 may include, for example, copper or another metal, or a metal alloy, or other conductive material.

Figure 5H:
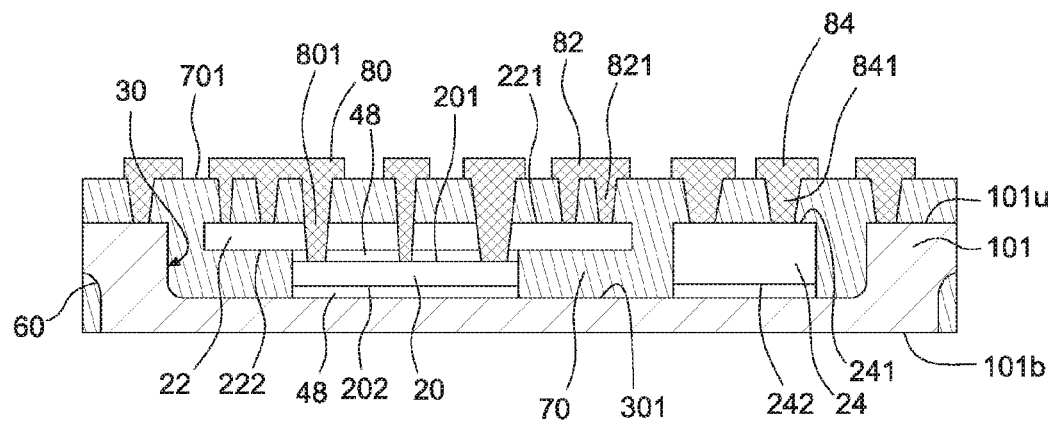

Referring to FIG. 5H, the patterned photoresist layer 74 is removed by a suitable technique, such as an etching process. The upper surfaces of the interconnection structures 801 and 821 are exposed.

Figure 5I:
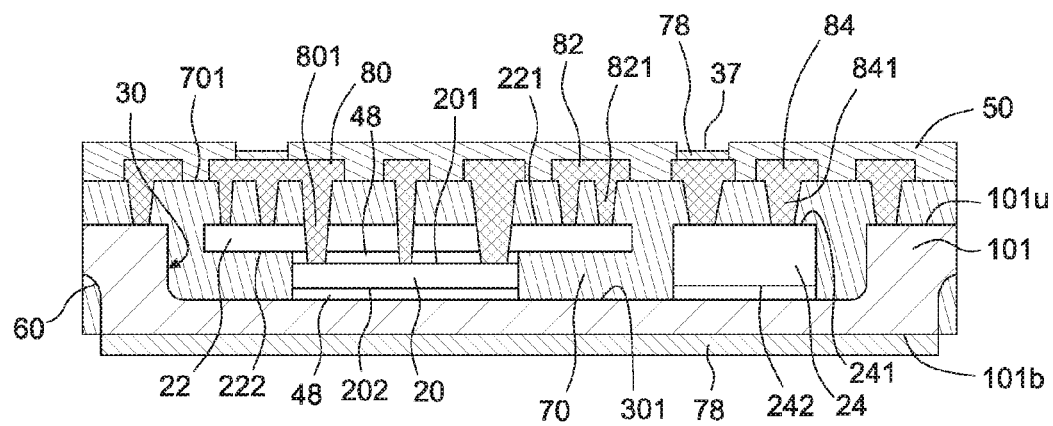

Referring to FIG. 5I, an insulating layer 50 is disposed on the first surface 701 of the protection layer 70. The insulating layer 50 covers at least a portion of the patterned conductive layers 80. A material of one or both of the insulating layer 50 may include a polypropylene resin or other insulating materials used additionally or alternatively. A surface finish layer 78 is disposed on the second surface 101b of the conductive base 101 and is filled into, or is formed in the vias 37. The surface finish layer 78 may include any suitable conductive material (such as, for example, nickel (Ni), palladium (Pd), gold (Au), silver (Ag), Cu, and/or combinations of metals). In at least one embodiment, the surface finish layer 78 may be disposed on the second surface 101b of the conductive base 101 and cover a portion of the protection layer 70 that fills, at least in part, the curved structure 60. In the at least one embodiment, the surface finish layer is, for example, an insulating layer, such as a solder mask. Next, the conductive connects 75 are filled into or formed in the vias 37, thus forming the semiconductor device package 2 as illustrated in FIG. 4A.

Figure 6A:
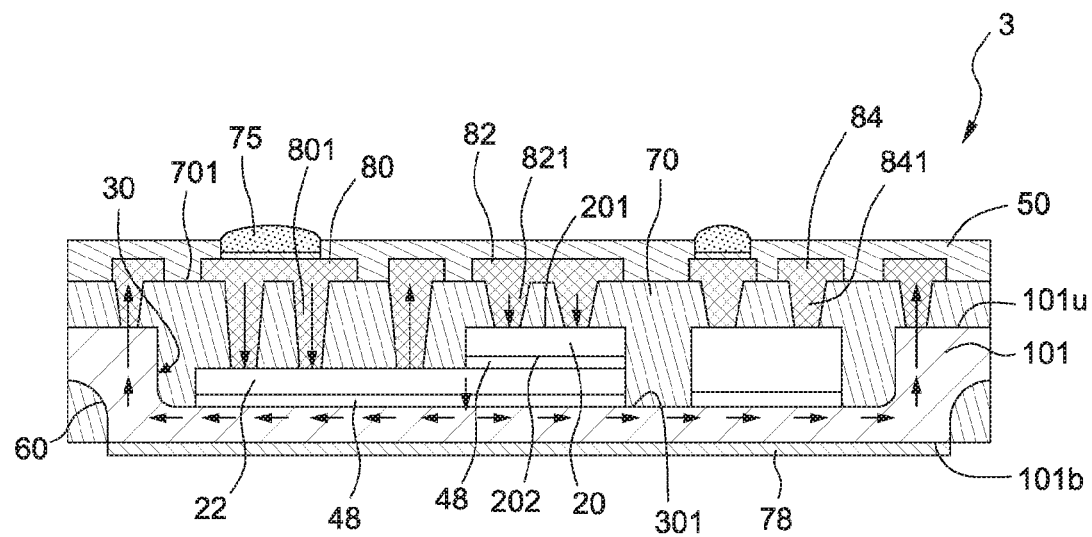
FIG. 6A is a cross-sectional view of some embodiments of a semiconductor device package in accordance with a third aspect of the present disclosure.

FIG. 6A is a cross-sectional view of some embodiments of a semiconductor device package 3 in accordance with a third aspect of the present disclosure. The semiconductor device package 3 is similar in some ways to the semiconductor device package 2 depicted in FIG. 4A, and some same-numbered components are not described again with respect to FIG. 4A. The conductive base 101 defines a cavity 30 in the first surface 101u of the conductive base 101. The cavity 30 has a bottom surface 301. The semiconductor die 22 has an active surface 221 connected to the patterned conductive layer 80 and a surface 222 on the bottom surface 301 of the cavity 30. The semiconductor die 20 has an active surface 201 connected to the patterned conductive layer 82 and a surface 202 on the active surface 221 of the semiconductor die 22. The semiconductor die 22 is disposed on the bottom surface 301 of the cavity 30 and the semiconductor die 20 is disposed on the active surface 221 of the semiconductor die 22.

The semiconductor die 24 has an active surface 241 connected to the patterned conductive layer 84 and a surface 242 on the bottom surface 301 of the cavity 30. The semiconductor die 24 is disposed on the bottom surface 301 of the cavity 30. One of the semiconductor dies 20, 22 and 24 may be a power die, and one of the semiconductor die 20, 22 and 24 may be a control die. The first surface 101u of the conductive base 101 is electrically connected to the active surface 221 of the semiconductor die 22 and the active surface 201 of the stacked semiconductor die 20 through the interconnection structures 801 and 821.

Figure 6B:
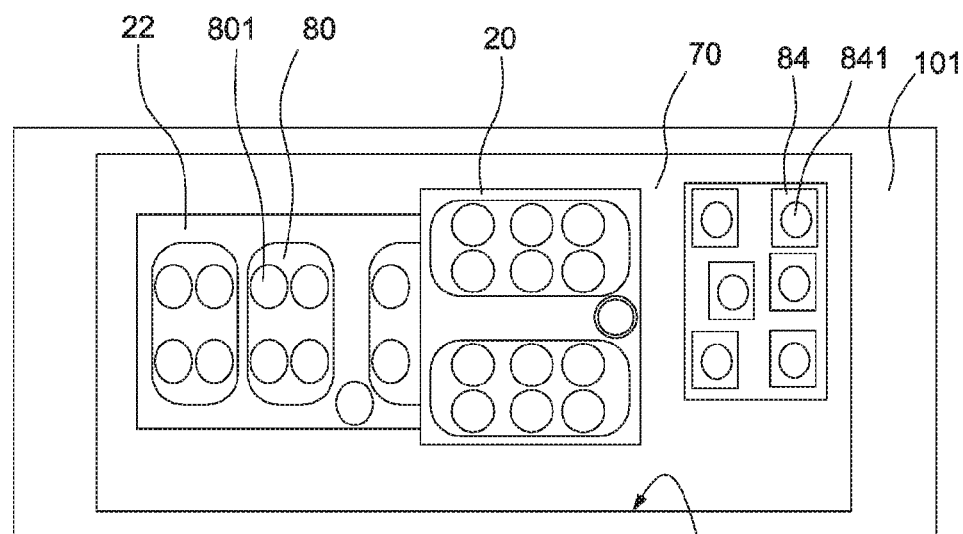
FIG. 6B illustrates a top view of some embodiments of the semiconductor device package depicted in FIG. 6A.

FIG. 6B illustrates a top view of some embodiments of the semiconductor device package 3 depicted in FIG. 6A. In FIG. 6B, the semiconductor die 20 and the semiconductor die 22 are at least slightly offset and do not perfectly overlap. A current output by the semiconductor die 22 may be transferred to the conductive base 101 through the conductive adhesive layer 48 and transferred to the interconnection structures 801 through the patterned conductive layers 80. A current output by the semiconductor die 20 may be transferred to the conductive base 101 through the semiconductor die 22 and the conductive adhesive layer 48 and transferred to the interconnection structures 821 through the patterned conductive layers 82. The offset of the semiconductor dies 20 and 22 may implemented as desired (e.g. may be made large or small).

Figure 7A:
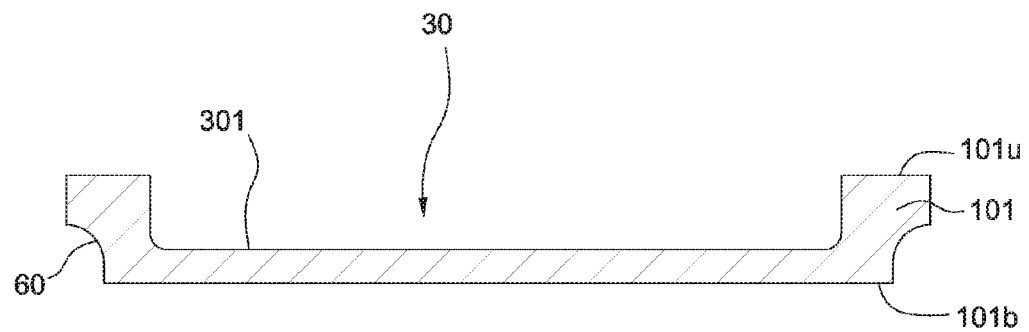
FIG. 7A, FIG. 7B, FIG. 7C, FIG. 7D, FIG. 7E, FIG. 7F, FIG. 7G, FIG. 7H, and FIG. 7I illustrate some embodiments of a method of manufacturing the semiconductor device package depicted in FIG. 6A.

FIGS. 7A-7I illustrate some embodiments of a method of manufacturing the semiconductor device package 3 depicted in FIG. 6A. Referring to FIG. 7A, a conductive base 101 is provided. The conductive base 101 has a first surface 101u and a surface 101b opposite to the first surface 101u. The material of the conductive base 101 includes, for example, copper or another metal, or a metal alloy, or other conductive material. The conductive base 101 defines a cavity 30 in the first surface 101u of the conductive base 101. The cavity 30 has a bottom surface 301. The conductive base 101 defines curved structures 60.

Figure 7B:
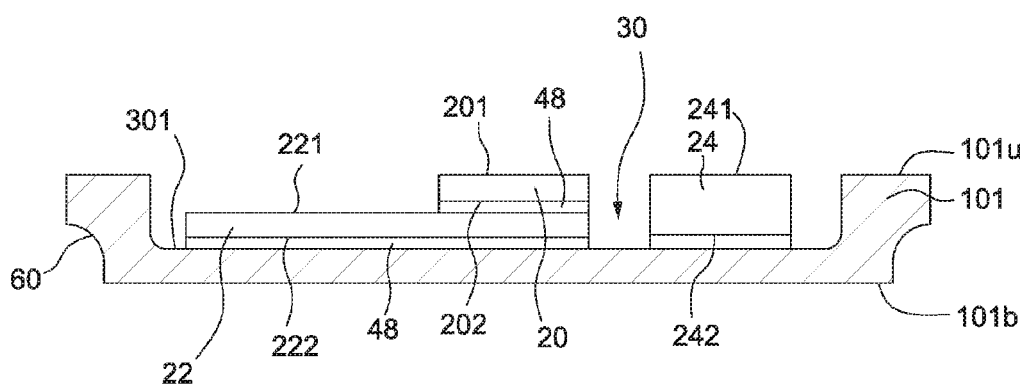

Referring to FIG. 7B, conductive adhesive layers 48 are disposed on the bottom surface 301 of the cavity 30. The conductive adhesive layer 48 may include, for example, a conductive gel or epoxy film (epoxy mixed with a conductive material). A semiconductor die 22 is disposed on the conductive adhesive layer 48 in the bottom surface 301 of the cavity 30. The conductive adhesive 48 is used to attach the semiconductor die 22 to the bottom surface 301 of the cavity 30. The semiconductor die 22 has an active first surface 221 and a second surface 222 opposite the first surface 221. A semiconductor die 20 has an active surface 201 and a surface 202 opposite the first surface 201. The semiconductor die 20 is stacked on the active surface 221 of the semiconductor die 22 through a conductive adhesive layer 48. The semiconductor die 24 has an active first surface 241 and a second surface 242 opposite the first surface 241. The semiconductor die 24 is disposed on the conductive adhesive layer 48 on the bottom surface 301 of the cavity 30.

Figure 7C:
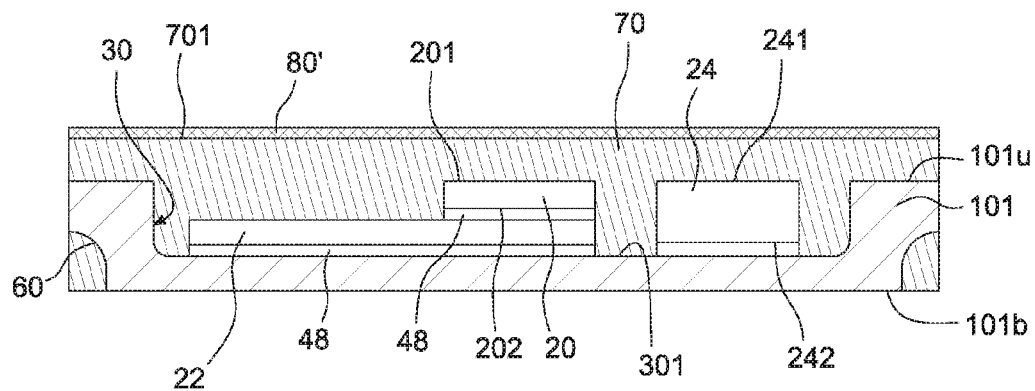

Referring to FIG. 7C, a protection layer 70 is disposed on the semiconductor dies 20, 22 and 24 and fills, at least in part, the cavity 30. The protection layer 70 has a surface 701. In some embodiments, the material of the protection layer 70 may include a polypropylene resin; however, other suitable materials may be additionally or alternatively used. The conductive layer 80' is disposed on the surface 701 of the protection layer 70. A material of conductive layer 80' may include, for example, copper or another metal, or a metal alloy, or other conductive material.

Figure 7D:
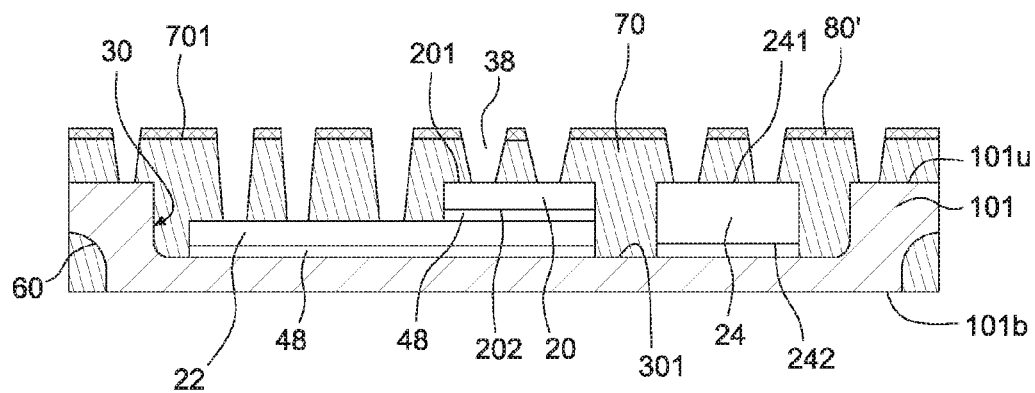

Referring to FIG. 7D, vias 38 are formed through the protection later 70 from the surface of the conductive layer 80'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101*u* of the conductive base 101 are exposed.

Figure 7E:
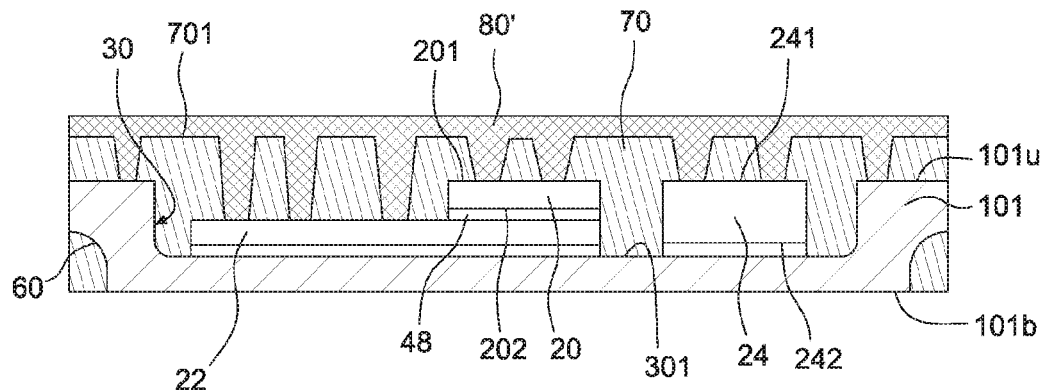

Referring to FIG. 7E, the vias 38 are filled with the conductive material similar to, or the same as, the material of the conductive layer 80'. The thickness of conductive layer 80' is increased by coating, sputtering, plating or another suitable technique.

Figure 7F:
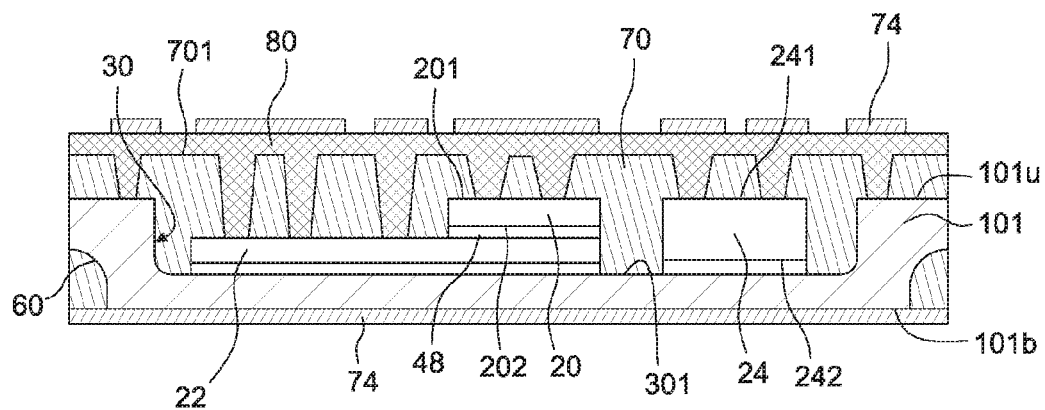

Referring to FIG. 7F, a patterned photoresist layer 74 is disposed on the conductive layers 80', on the surface 101*b* of the conductive base 101, and on the bottom surface of a portion of the protection layer 70 that fills, at least in part, the curved structure 60. The patterned photoresist layer 74 may include a positive photoresist or other suitable material.

Figure 7G:
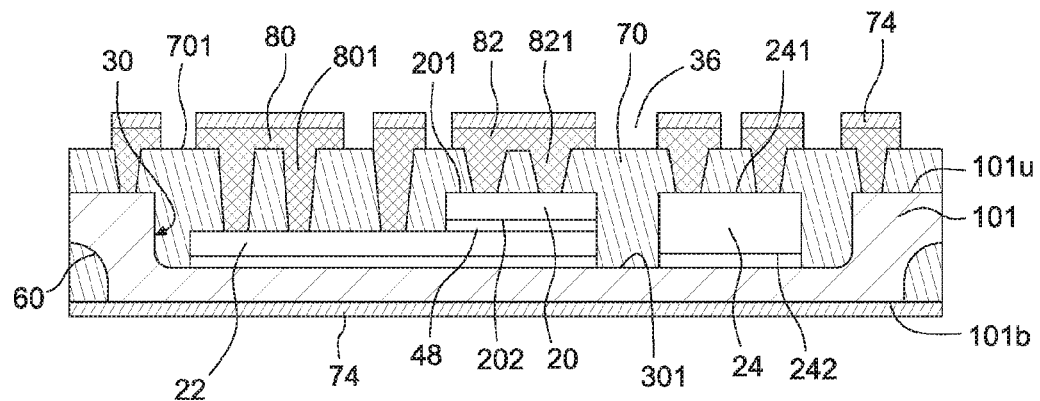

Referring to FIG. 7G, vias 36 are formed through the protection later 70 from the surface of the conductive layer 80'. After the vias 36 are formed, the conductive layers 80 and 82 and the interconnection structures 801 and 802 are formed. The material of interconnection structures 801 and 802 and conductive layers 80 and 82 may include, for example, copper or another metal, or a metal alloy, or other conductive material.

Figure 7H:
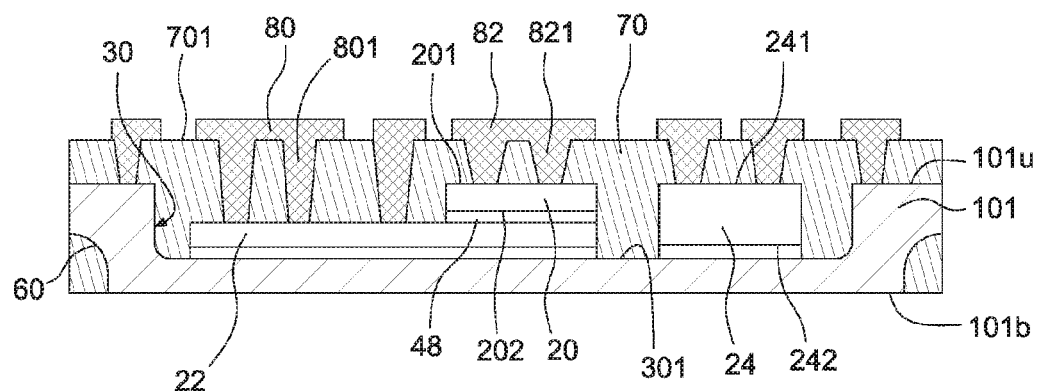

Referring to FIG. 7H, the patterned photoresist layer 74 is removed by a suitable technique, such as an etching process. The first surfaces of the interconnection structures 801 and 821 are exposed.

Figure 7I:
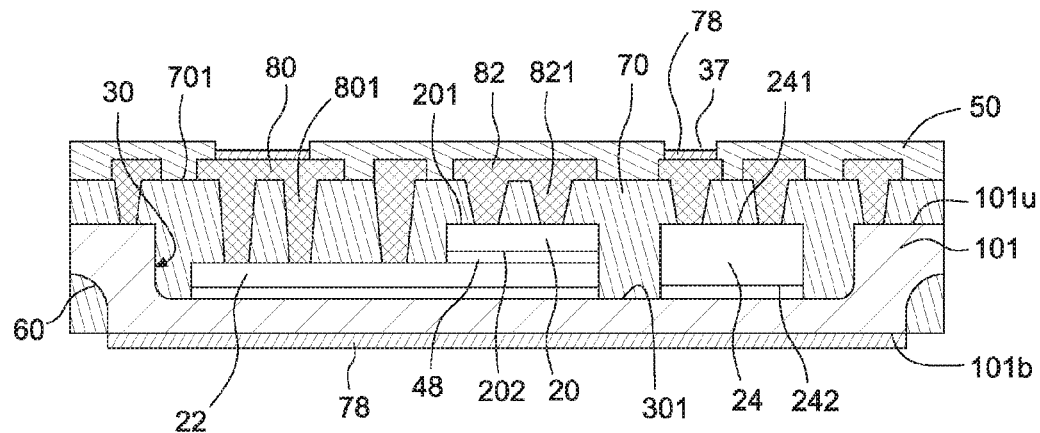

Referring to FIG. 7I, an insulating layer 50 is disposed on the first surface 701 of the protection layer 70. The insulating layer 50 covers at least a portion of the patterned conductive layers 80. A material of one or both of the insulating layer 50 may include a polypropylene resin or other insulating materials used additionally or alternatively. A surface finish layer 78 is disposed on the surface 101*b* of the conductive base 101 and filled into the vias 37. The protection layer 70 filled in the curved structure 60 is exposed from the surface finish layer 78 when the surface finish layer 78 may include any suitable conductive material (such as including, for example, nickel (Ni), palladium (Pd), gold (Au), silver (Ag), Cu, and combinations of metals). In one embodiment, the surface finish layer may be disposed on the surface 101*b* of the conductive base 101 and cover the protection layer 70 that fills, at least in part, the curved structure 60. In some embodiments, the surface finish layer is, for example, an insulating layer, such as a solder mask. Next, the conductive connects 75 are filled into the vias 37 to complete the semiconductor device package 3 as illustrated in FIG. 6A.

Figure 8:
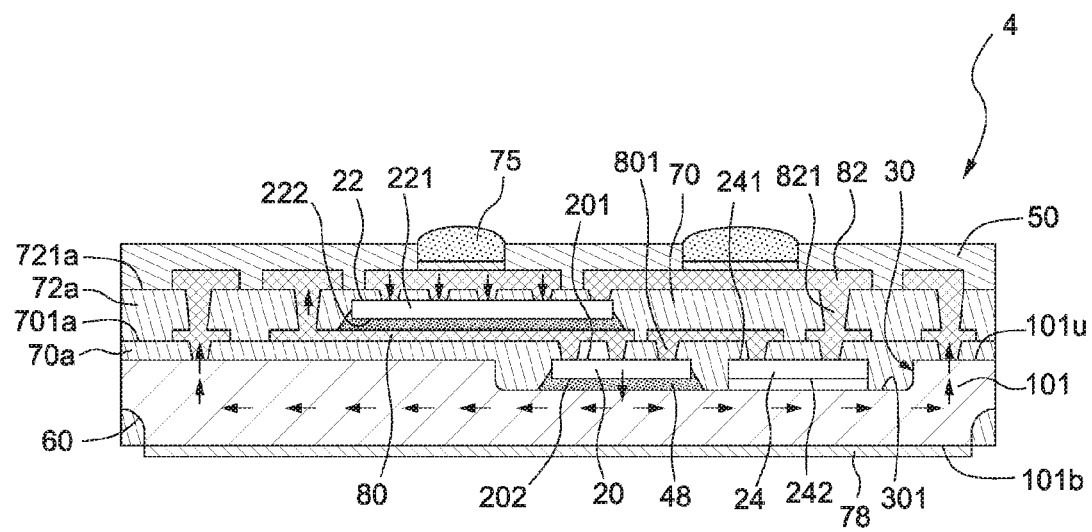
FIG. 8 is a cross-sectional view of some embodiments of a semiconductor device package in accordance with a fourth aspect of the present disclosure.

FIG. 8 is a cross-sectional view of some embodiments of a semiconductor device package 4 in accordance with a fourth aspect of the present disclosure. The semiconductor device package 4 is similar in some ways to the semiconductor device package 1 of FIG. 1, and some same-numbered components are not described again with respect to FIG. 8. In FIG. 8, the semiconductor device package 4 includes a conductive base 101, semiconductor dies 20, 22 and 24, conductive adhesive layers 48, protection layers 70*a* and 72*a*, an insulating layer 50, patterned conductive layers 80, 82, 84 and 86, interconnection structures 801, 821, 841 and 861, and conductive connects 75.

The protection layer 70*a* covers at least a portion of the surface 101*u* of the conductive base 101 and the semiconductor die 20. The protection layer 70*a* has a surface 701*a*. The protection layer 70*a* covers at least a portion of the semiconductor dies 22 and 24. The patterned conductive layer 80 is formed on the protection layer 70*a* and is electrically connected to the semiconductor die 20. The semiconductor die 22 is bonded to the patterned conductive layer 80 through the conductive adhesive layer 48. The semiconductor die 24 is bonded to the patterned conductive layer 80 through the conductive adhesive layer 48. The protection layer 72*a* is formed on the patterned conductive layer 80 and on the surface 701*a* of the protection layer 70*a*. The protection layer 72*a* covers at least a portion of the semiconductor die 22. The patterned conductive layer 82 is disposed on the dielectric layer 72*a* and is electrically connected to the semiconductor die 22.

The semiconductor die 20 has an active surface 201 and a surface 202. The conductive base 101 defines a cavity 30 in the first surface 101*u* of the conductive base 101. The semiconductor die 20 is bonded to a bottom surface 301 of the cavity 30 through the conductive adhesive layer 48. The interconnection structures 801 are formed in the protection layer 70*a*. The interconnection structures 801 are electrically connected to the surface 101*u* of the conductive base 101 and the patterned conductive layer 80. The active surface 201 of the semiconductor die 20 is electrically connected to the patterned conductive layer 80 through the interconnection structures 801. The semiconductor die 22 has an active surface 221 and a surface 222. The semiconductor die 20 is bonded to the active surface 201 of the semiconductor die 20 through the conductive adhesive layer 48. The interconnection structures 821 are formed in the protection layer 72*a*. The interconnection structures 821 are connected to the patterned conductive layer 80 and the patterned conductive layer 82. The active surface 222 of the semiconductor die 22 is connected to the patterned conductive layer 82 through the interconnection structures 821. The semiconductor die 24 has an active surface 241 and a surface 242. The semiconductor die 24 is bonded to the bottom surface 301 of the cavity 30 through the conductive adhesive layer 48. The active surface 201 of the semiconductor die 20 is connected to the active surface 241 of the semiconductor die 24 through the patterned conductive layers 80 and the interconnection structures 801. A material of interconnection structures 801 and 821 and patterned conductive layer 80 and 82 may include, for example, copper or another metal, or a metal alloy, or other conductive material.

Figure 9A:
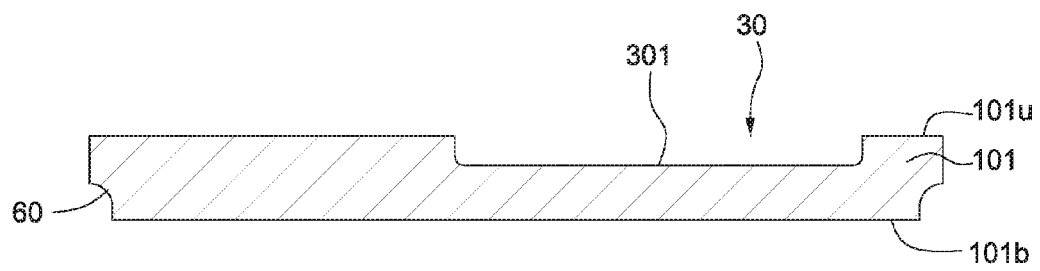
FIG. 9A, FIG. 9B, FIG. 9C, FIG. 9D, FIG. 9E, FIG. 9F, FIG. 9G, FIG. 9H, FIG. 9I, FIG. 9J, FIG. 9K, and FIG. 9L illustrate some embodiments of a method of manufacturing the semiconductor device package of FIG. 8.

FIGS. 9A-9L illustrate some embodiments of a method of manufacturing the semiconductor device package 4 depicted in FIG. 8. Referring to FIG. 9A, a conductive base 101 is provided. The conductive base 101 has a first surface 101*u* and a surface 101*b* opposite to the first surface 101*u*. The conductive base 101 defines curved structures 60. The material of the conductive base 101 is, for example, copper or another metal, or a metal alloy, or other conductive material. The conductive base 101 defines a cavity 30 in the first surface 101u of the conductive base 101. The cavity 30 has a bottom surface 301.

Figure 9B:
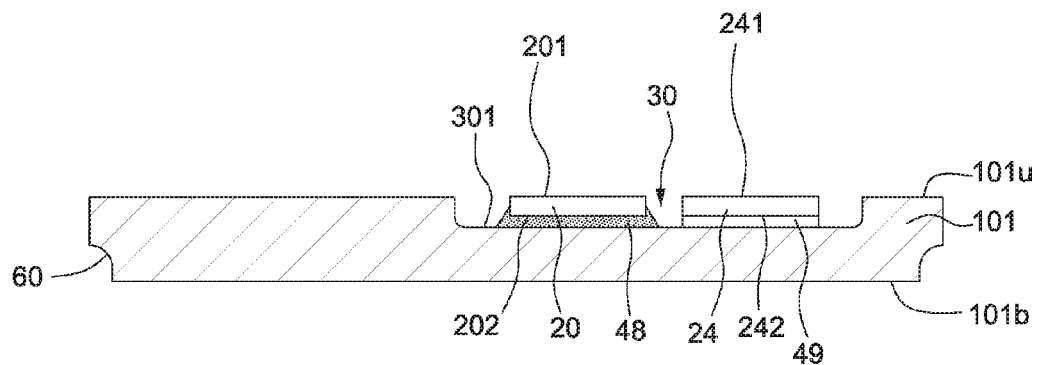

Referring to FIG. 9B, a conductive adhesive layer 48 and a die attach film 49 are disposed on the bottom surface 301 of the cavity 30. The conductive adhesive layer 48 may include, for example, a conductive gel or epoxy film (epoxy mixed with a conductive material). In some embodiments, the conductive adhesive layer 48 may include a die attach film. A semiconductor die 20 is disposed on the conductive adhesive layer 48 in the bottom surface 301 of the cavity 30. The conductive adhesive 48 is used to attach the semiconductor die 20 to the bottom surface 301 of the cavity 30. The semiconductor die 20 has an active first surface 201 and a second surface 202 opposite the first surface 201. A semiconductor die 24 is disposed on the die attach film 49 in the bottom surface 301 of the cavity 30. The die attach film 49 is used to attach the semiconductor die 24 to the bottom surface 301 of the cavity 30. The semiconductor die 24 has an active first surface 241 and a second surface 242 opposite the first surface 201.

Figure 9C:
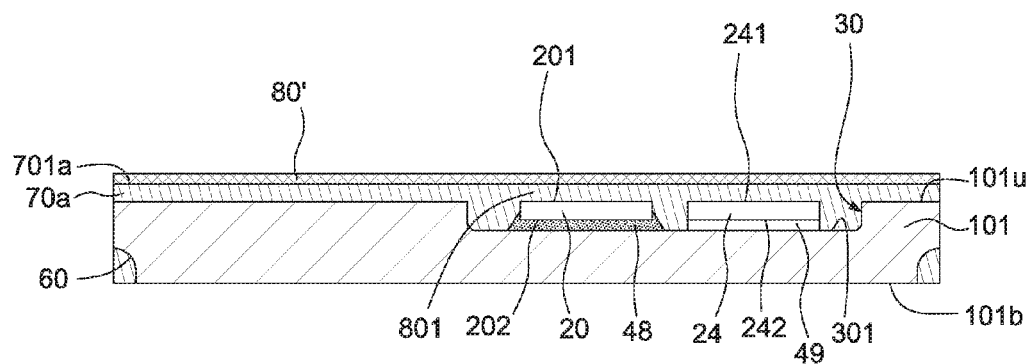

Referring to FIG. 9C, a protection layer 70a is disposed on the semiconductor dies 20 and 24 and fills, at least in part, the cavity 30 and the curved structures 60. The protection layer 70a has a surface 701a. In some embodiments, the material of the protection layer 70a may include a polypropylene resin; however, other suitable materials may be additionally or alternatively used. The conductive layer 80' is disposed on the surface 701a of the protection layer 70a. A material of conductive layer 80' may include, for example, copper or another metal, or a metal alloy, or other conductive material.

Figure 9D:
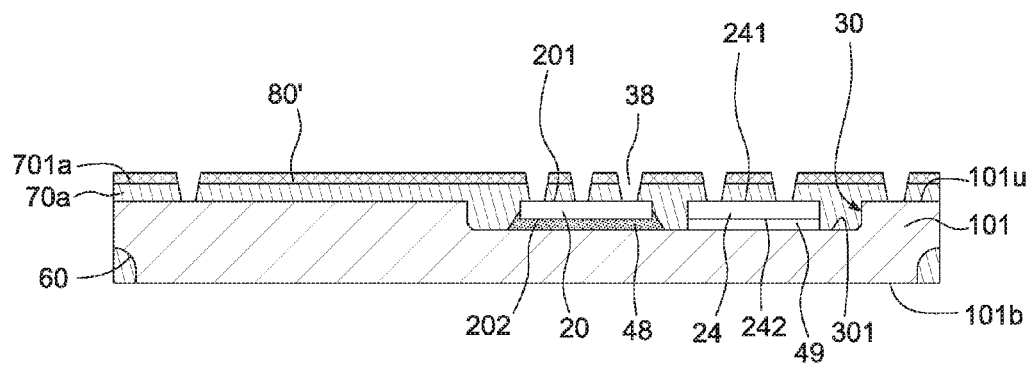

Referring to FIG. 9D, vias 38 are formed through the protection later 70a from the surface of the patterned conductive layer 80'. The vias 38 may be formed, for example, by drilling. After the vias 38 are formed, a portion of the surface 201 of the semiconductor die 20, a portion of the surface 241 of the semiconductor die 24, and a portion of the surface 101u of the conductive base 101 are exposed.

Figure 9E:
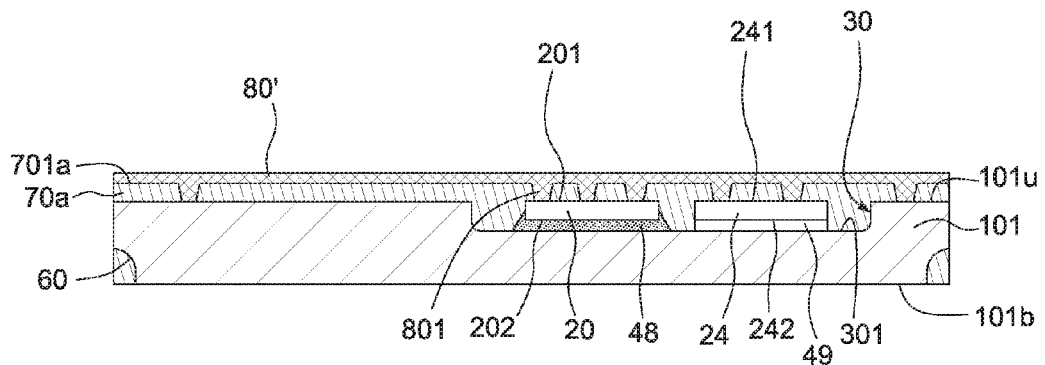

Referring to FIG. 9E, the vias 38 are filled with a conductive material similar to or the same as the material of the conductive layer 80'. The thickness of conductive layer 80' is increased by coating, sputtering, plating or another suitable technique.

Figure 9F:
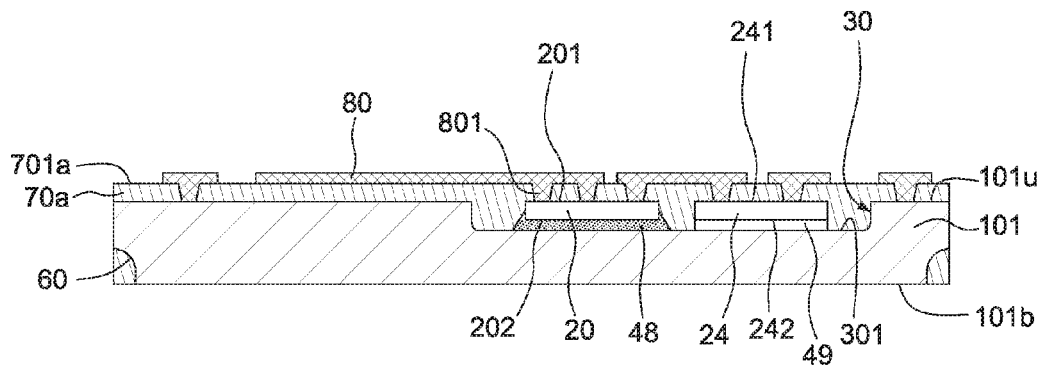
Figure 9G:
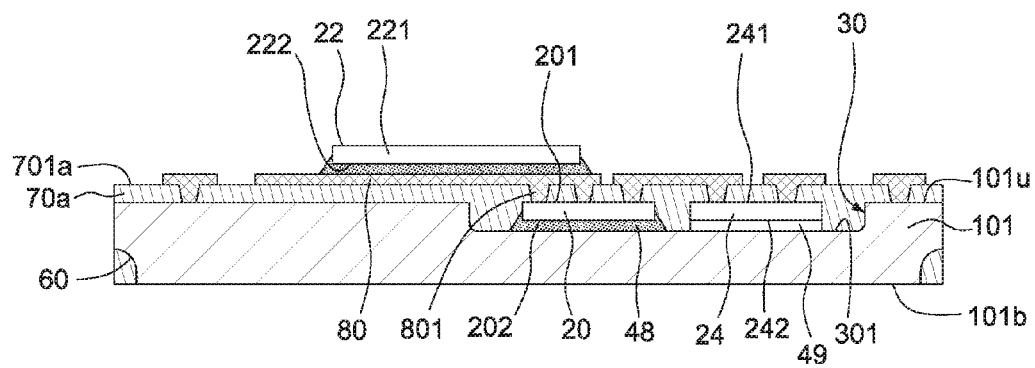

Referring to FIG. 9F, the conductive layers 80 and the interconnection structures 801 are formed by photo-lithography techniques. The material of interconnection structures 801 and conductive layers 80 may include, for example, copper or another metal, or a metal alloy, or other conductive material. Referring to FIG. 9G, a semiconductor die 22 is disposed on the interconnection structures 801 through the conductive adhesive layer 48. The semiconductor dies 20 and 22 may be a power die, and the semiconductor die 24 may be a control die.

Figure 9H:
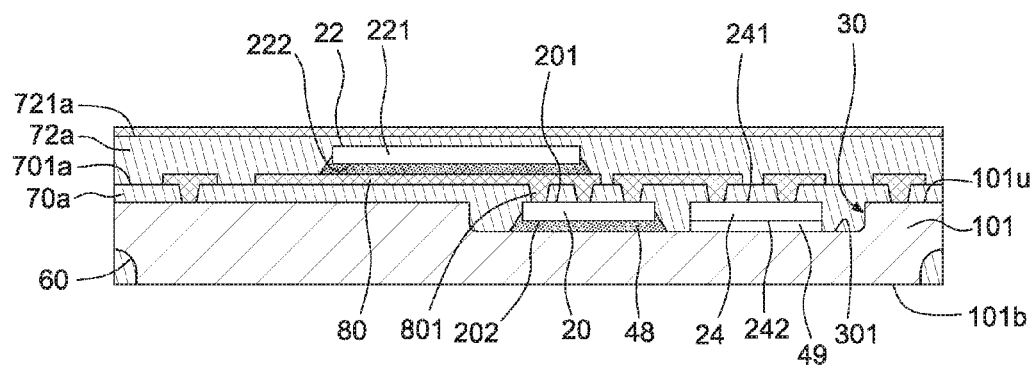

Referring to FIG. 9H, a protection layer 72a is disposed on the semiconductor die 22 and covers the interconnection structures 801. The protection layer 72a has a surface 721a. In some embodiments, the material of the protection layer 72a may include a polypropylene resin; however, other suitable materials may be additionally or alternatively used. A conductive layer 82' is disposed on the surface 721a of the protection layer 72a. A material of conductive layer 82' may include, for example, copper or another metal, or a metal alloy, or other conductive material.

Figure 9I:
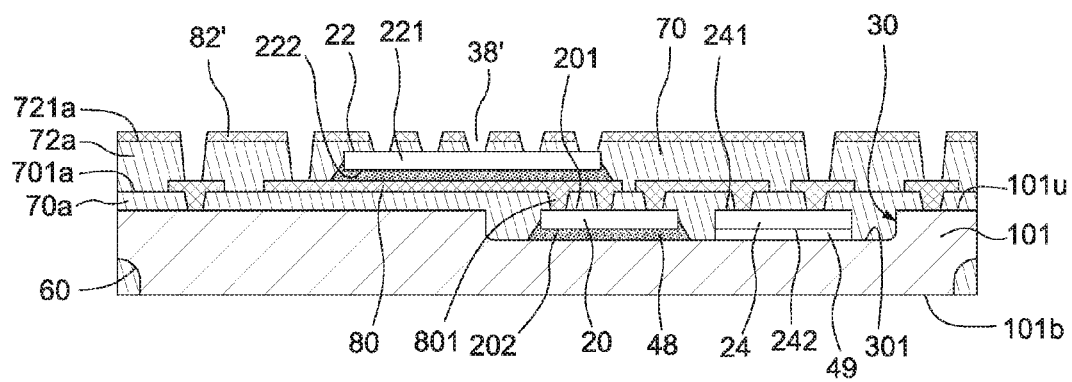

Referring to FIG. 9I, vias 38' are formed through the protection later 72a from the surface of the patterned conductive layer 82'. The vias 38' may be formed, for example, by drilling. After the vias 38' are formed, a portion of the surface 221 of the semiconductor die 22 and a portion of the surface of the interconnection structures 801 are exposed.

Figure 9J:
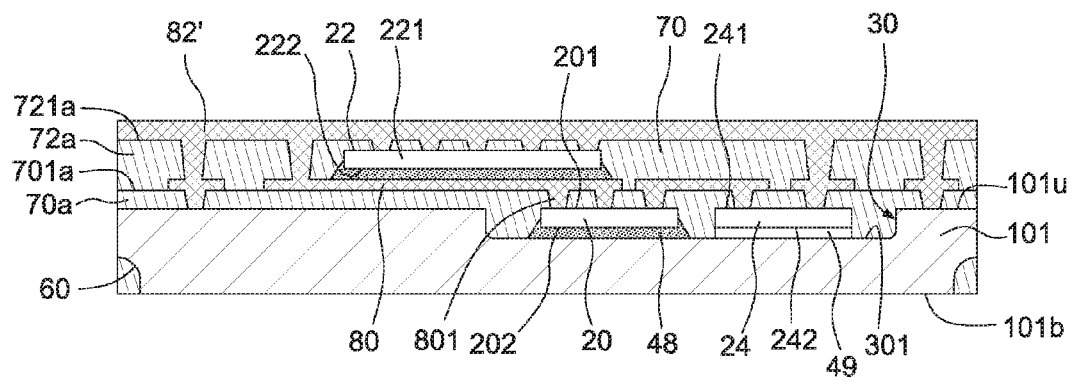

Referring to FIG. 9J, the vias 38 are filled with the conductive material similar to, or the same as, the material of the conductive layer 82'. The thickness of conductive layer 82' is increased by coating, sputtering, plating or another suitable technique.

Figure 9K:
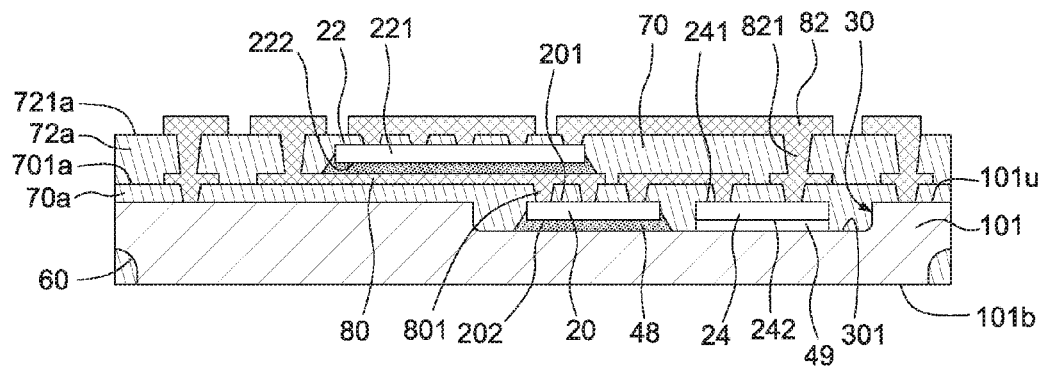

Referring to FIG. 9K, the conductive layers 82 and the interconnection structures 821 are formed by photo-lithography techniques. The material of interconnection structures 821 and conductive layers 82 may include, for example, copper or another metal, or a metal alloy, or other conductive material.

Figure 9L:
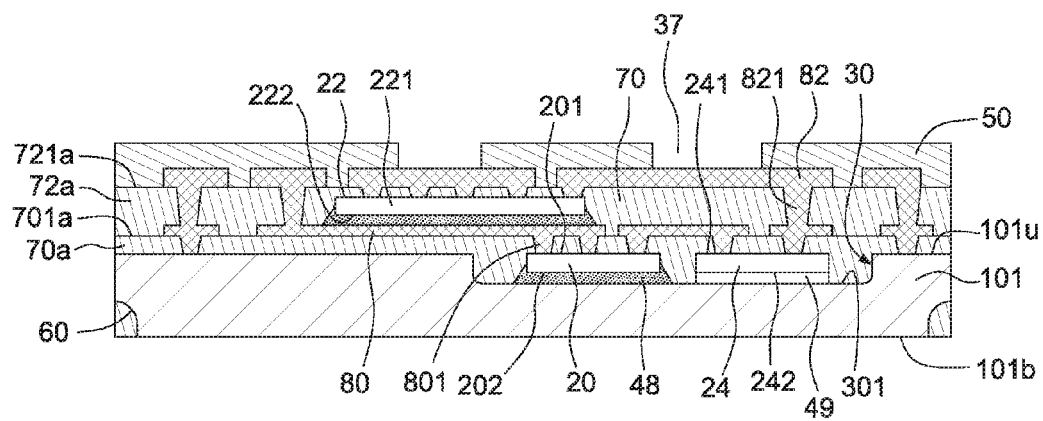

Referring to FIG. 9L, an insulating layer 50 is disposed on the first surface 721 of the protection layer 72a. The insulating layer 50 covers at least a portion of the patterned conductive layers 82. A material of one or both of the insulating layer 50 may include a polypropylene resin or other insulating materials used additionally or alternatively. Next, the conductive connects 75 are filled into or formed in the vias 37, thus forming the semiconductor device package 4 as illustrated in FIG. 8.

Figure 10A:
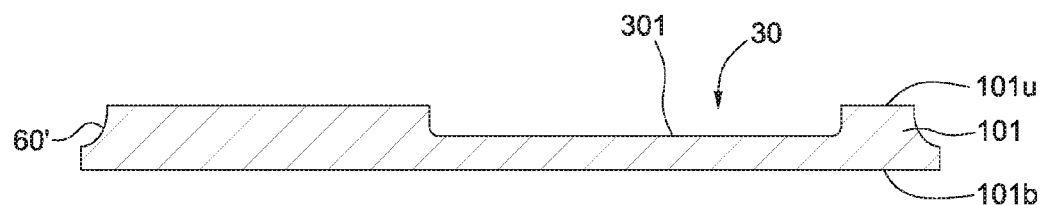
FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, and FIG. 10M illustrate some embodiments of a method of manufacturing a semiconductor device package according to a fifth aspect.

FIGS. 10A-10M illustrate some embodiments of a method of manufacturing a semiconductor device package 5 according to a fifth aspect of the present disclosure. Referring to FIG. 10A, a conductive base 101 is provided. The conductive base 101 has a first surface 101u and a surface 101b opposite to the first surface 101u. The conductive base 101 defines upper curved structures 60'. The material of the conductive base 101 is, for example, copper or another metal, or a metal alloy, or other conductive material. The cavity 30 is defined from the first surface 101u of the conductive base 101. The cavity 30 has a bottom surface 301.

Figure 10B:
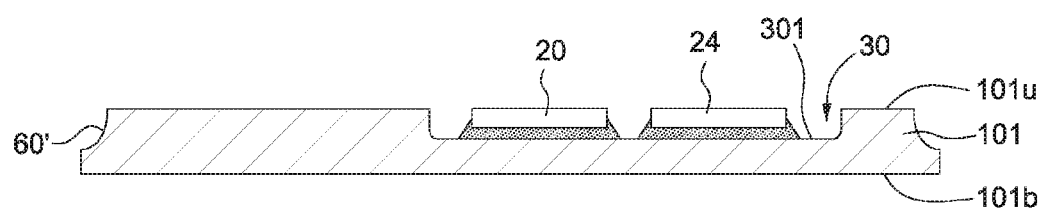

Referring to FIG. 10B, conductive adhesive layers 48 is disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 in the bottom surface 301 of the cavity 30. The conductive adhesive 48 is used to attach the semiconductor die 20 to the bottom surface 301 of the cavity 30. The semiconductor die 20 has an active first surface 201 and a second surface 202 opposite the first surface 201. A semiconductor die 24 is disposed on the conductive adhesive layer 48 in the bottom surface 301 of the cavity 30. The conductive adhesive 48 is used to attach the semiconductor die 24 to the bottom surface 301 of the cavity 30. The semiconductor die 24 has an active first surface 241 and a second surface 242 opposite the first surface 201. In some embodiments, the conductive adhesive layer 48 may be a die attach film. In some embodiments, the semiconductor die 20 may be a power die and the semiconductor die 24 may be a controller.

Figure 10C:
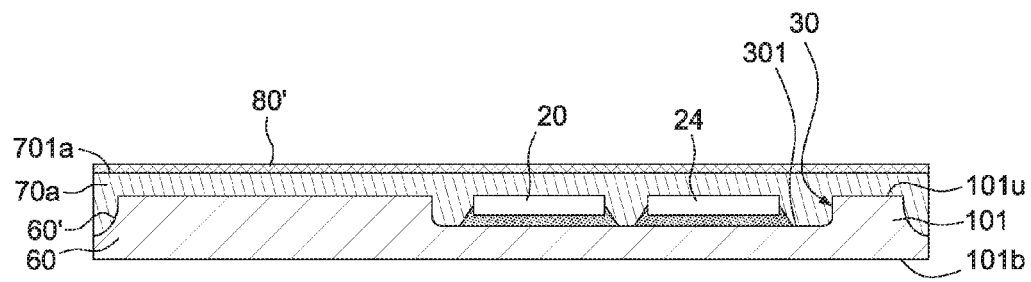

Referring to FIG. 10C, a protection layer 70a is disposed on the semiconductor dies 20 and 24 and fills, at least in part, the cavity 30 and the upper curved structures 60'. The protection layer 70a has a surface 701a. In some embodiments, the material of the protection layer 70a may include a polypropylene resin; however, other suitable materials may be additionally or alternatively used. The conductive layer 80' is disposed on the surface 701a of the protection layer 70a. A material of conductive layer 80' may include, for example, copper or another metal, or a metal alloy, or other conductive material.

Figure 10D:
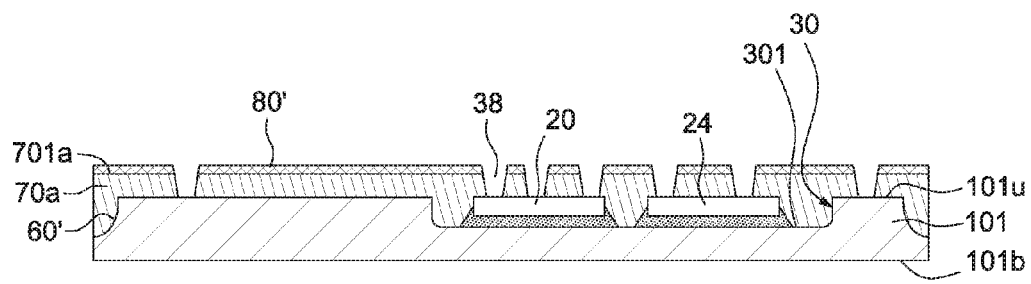

Referring to FIG. 10D, vias 38 are formed through the protection later 70a from the surface of the patterned conductive layer 80'. The vias 38 may be formed, for example, by drilling. After the vias 38 are formed, a portion of the surface 201 of the semiconductor die 20, a portion of the surface 241 of the semiconductor die 24, and a portion of the surface 101u of the conductive base 101 are exposed.

Figure 10E:
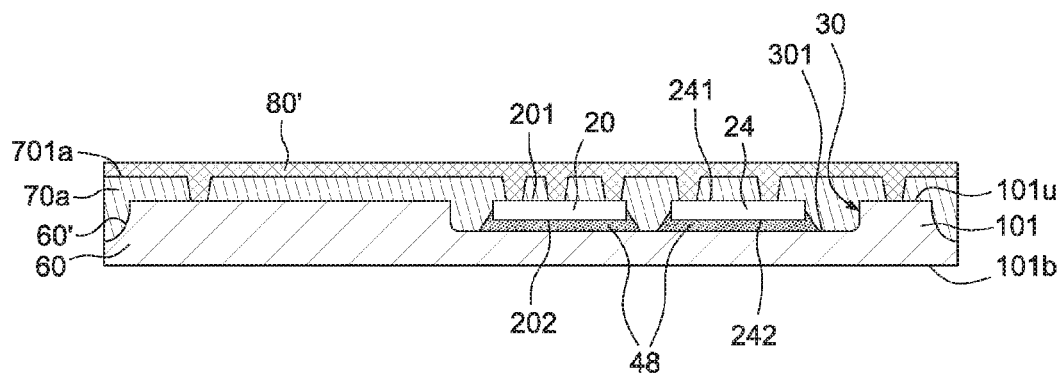

Referring to FIG. 10E, the vias 38 are filled with the conductive material similar to, or the same as, the material of the conductive layer 80'. The thickness of conductive layer 80' is increased by coating, sputtering, plating or another suitable technique.

Figure 10F:
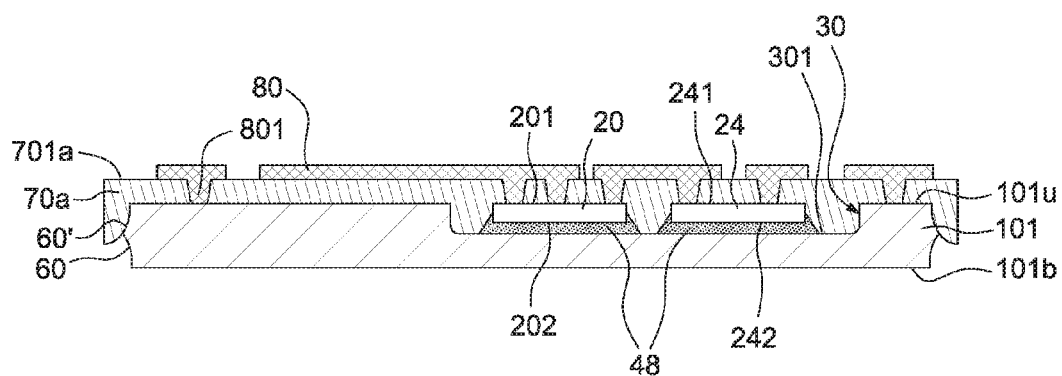

Referring to FIG. 10F, the conductive layers 80 and the interconnection structures 801 are formed by photo-lithography techniques. The material of interconnection structures 801 and conductive layers 80 may include, for example, copper or another metal, or a metal alloy, or other conductive material. A portion of the conductive base 101 below the upper curved structures 60' is removed by etching to form the curved structures 60.

Figure 10G:
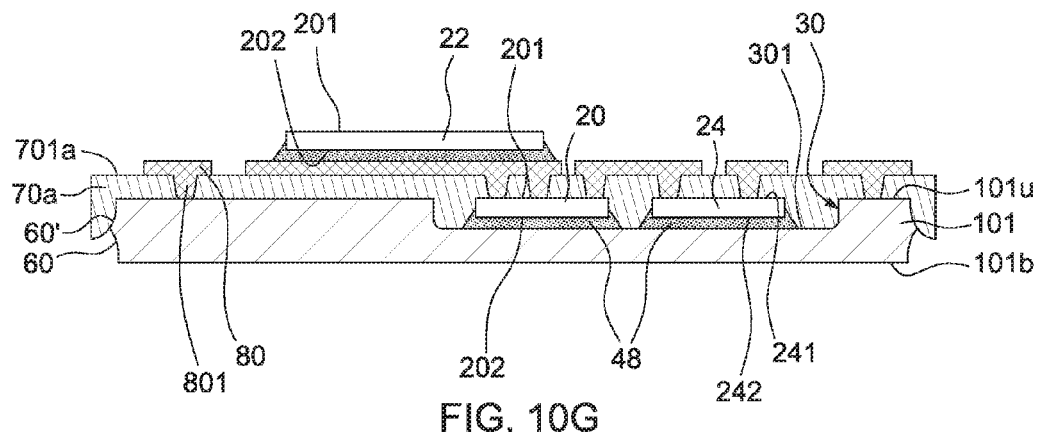

Referring to FIG. 10G, a semiconductor die 22 is disposed on the interconnection structures 801 through the conductive adhesive layer 48. At least one of the semiconductor dies 20, 22 and 24 may be a power die, and at least one of the semiconductor die 20, 22 and 24 may be a control die.

Figure 10H:
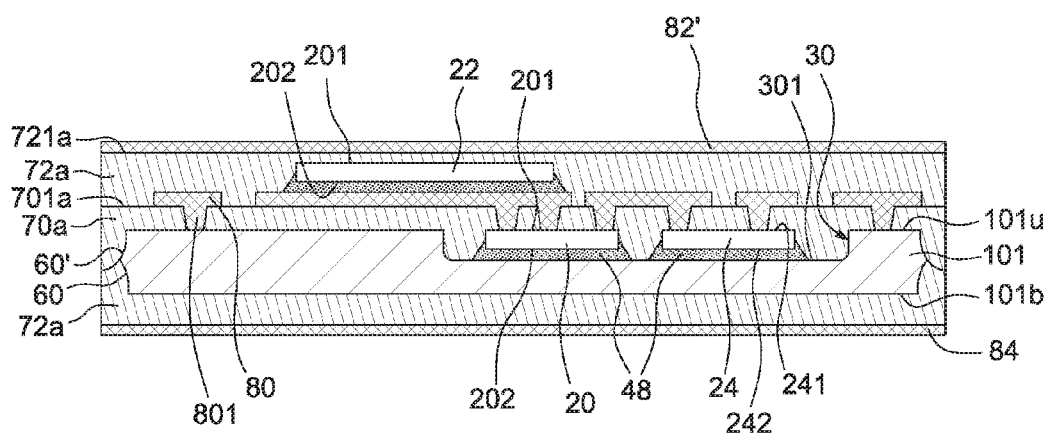

Referring to FIG. 10H, a protection layer 72a is disposed on the semiconductor die 22 and the surface 101b of the conductive base 101. The protection layer 72a also covers the interconnection structures 801 and fills, at least in part, the curved structures 60. The protection layer 72a has a surface 721a and a surface 721b. In some embodiments, the material of the protection layer 72a may include a polypropylene resin; however, other suitable materials may be additionally or alternatively used. A conductive layer 82' is disposed on the surface 721a of the protection layer 72a and a conductive layer 84 is disposed on the surface 721b of the protection layer 72a. A material of conductive layer 82' and 84 may include, for example, copper or another metal, or a metal alloy, or other conductive material.

Figure 10I:
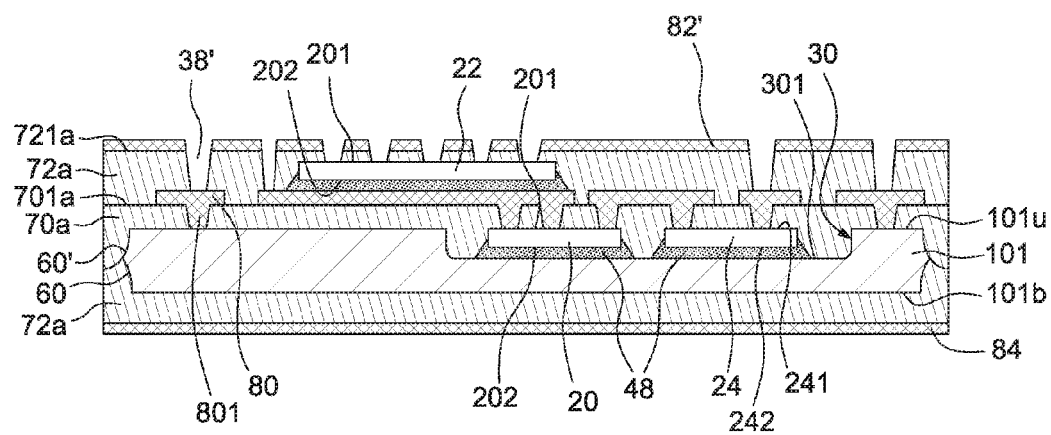

Referring to FIG. 10I, vias 38' are formed through the protection later 72a from the surface of the patterned conductive layer 82'. The vias 38' may be formed, for example, by drilling. After the vias 38' are formed, a portion of the surface 221 of the semiconductor die 22 and a portion of the surface of the interconnection structures 801 are exposed.

Figure 10J:
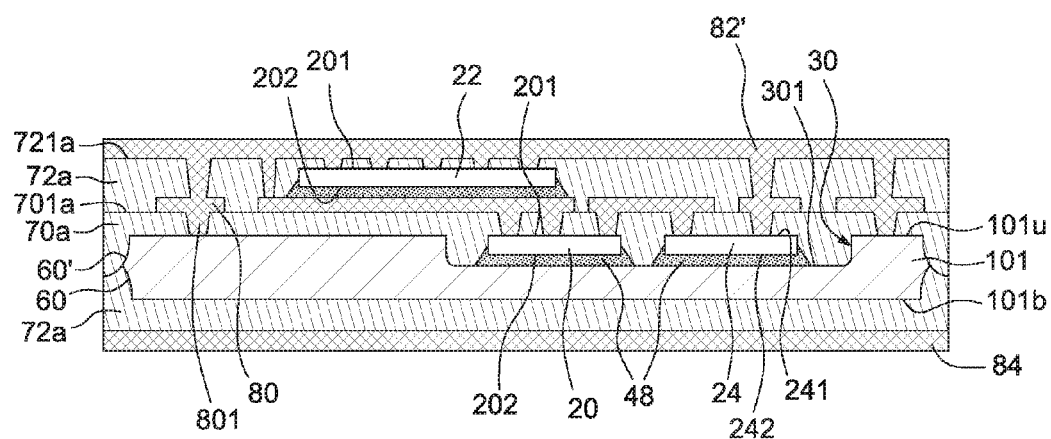
Figure 10K:
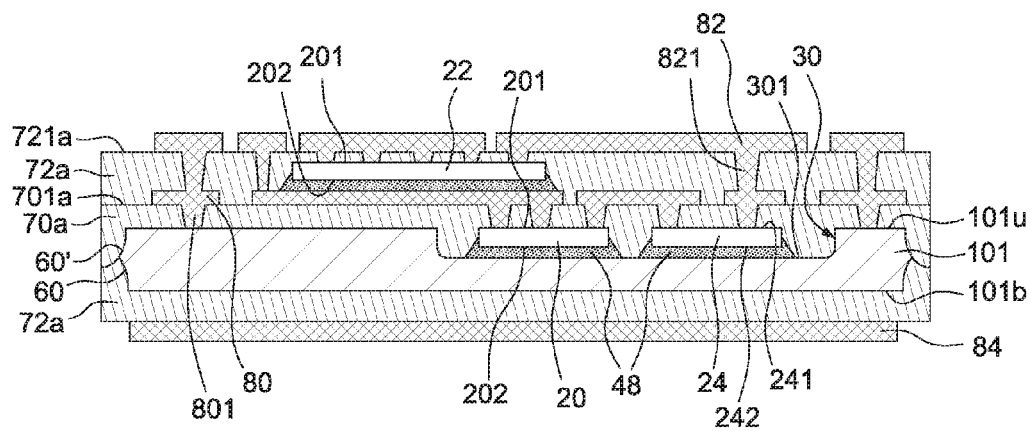

Referring to FIG. 10J, the vias 38 are filled with the conductive material similar to, or the same as, the material of the conductive layer 82'. The thickness of conductive layer 82' is increased by coating, sputtering, plating or another suitable technique. Referring to FIG. 10K, the conductive layers 82 and the interconnection structures 821 are formed by photo-lithography techniques. The material of interconnection structures 821 and conductive layers 82 may include, for example, copper or another metal, or a metal alloy, or other conductive material.

Figure 10L:
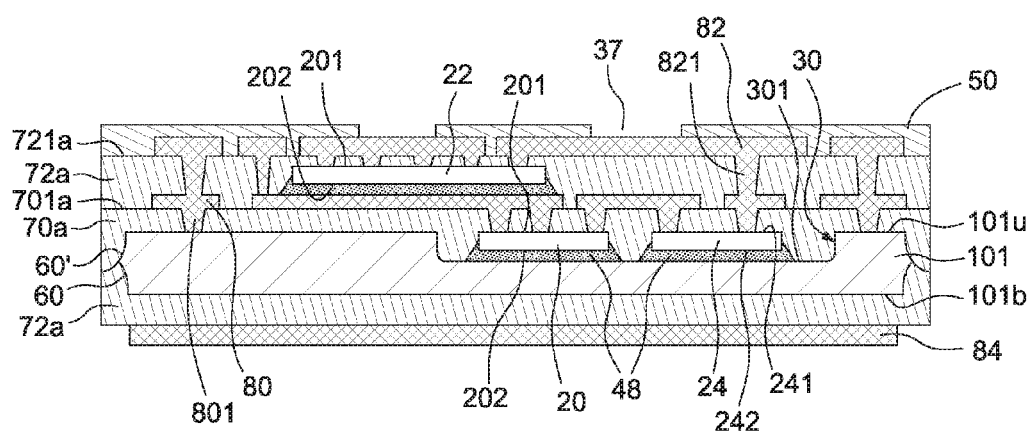
Figure 10M:
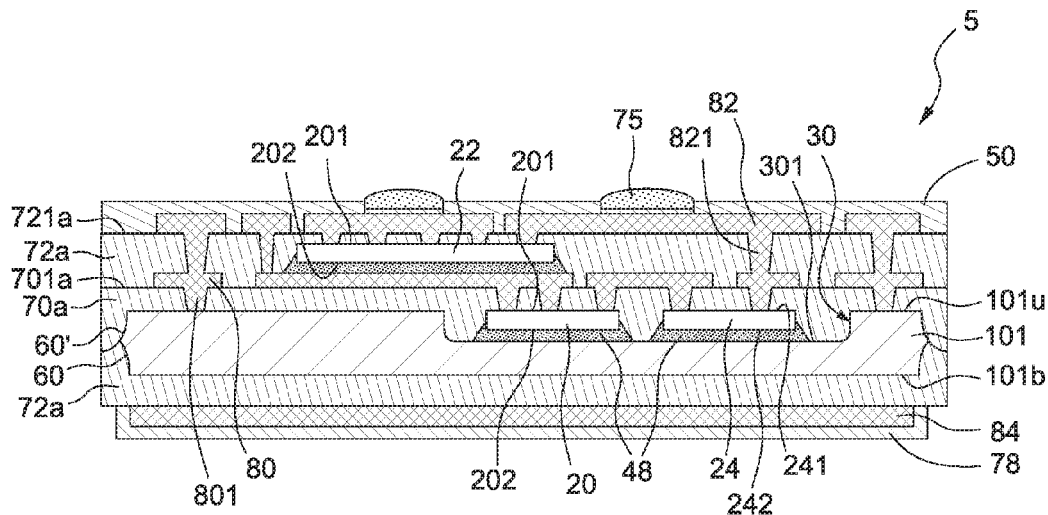

Referring to FIG. 10L, an insulating layer 50 is disposed on the first surface 721 of the protection layer 72a. The insulating layer 50 covers at least a portion of the patterned conductive layers 82. A material of one or both of the insulating layer 50 may include a polypropylene resin or other insulating materials used additionally or alternatively. Referring to FIG. 10M, the conductive connects 75 are filled into the vias 37. Next, a surface finish layer 78 is formed on the conductive layer 84 to form the semiconductor device package 5. The surface finish layer 78 may include any suitable conductive material (such as, for example, nickel (Ni), palladium (Pd), gold (Au), silver (Ag), Cu, and combinations of metals).

Figure 11A:
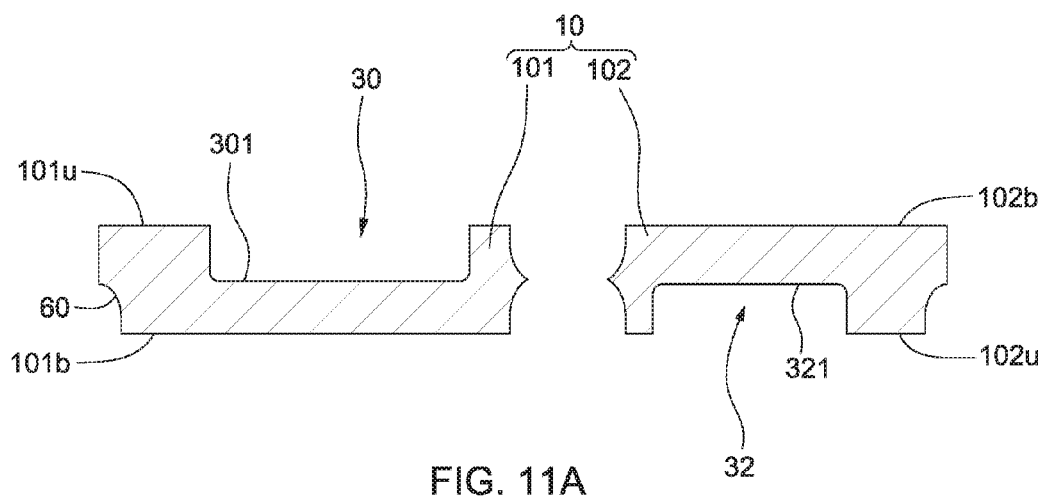
FIG. 11A, FIG. 11B, FIG. 11C, FIG. 11D, FIG. 11E, FIG. 11F, FIG. 11G, FIG. 11H, and FIG. 11I illustrate some embodiments of a method of manufacturing a semiconductor device package according to a sixth embodiment.

FIGS. 11A-11I illustrate some embodiments of a method of manufacturing a semiconductor device package 6 according to a sixth aspect. Referring to FIG. 11A, conductive bases 101 and 102 are provided. The conductive base 101 has a first surface 101u and a surface 101b opposite to the first surface 101u. The conductive base 102 has a first surface 102u and a surface 102b opposite to the first surface 102u. The material of the conductive bases 101 and 102 includes, for example, copper or another metal, or a metal alloy, or other conductive material. The connecting element 90 is formed, for example, by drilling (e.g. by drilling at least two holes into an initial conductive base, thereby forming the separate conductive bases 101 and 102 and the connecting element 90). The conductive base 101 defines a cavity 30 in the first surface 101u of the conductive base 101, and the conductive base 102 defines a cavity in the first surface 102u of the conductive base 102. The cavity 30 has bottom surface 301. The cavity 32 has an upper surface 321. The conductive base 101 defines one or more curved structures 60. Curved structures 60 of the conductive base 101 are smoothed and can help to redistribute stress to avoid damage to the protection layer 70 during lamination. The structure of the conductive base 101 may be formed in a same or similar manner as the conductive base 102, such as in any appropriate manner of forming a conductive based described herein.

Figure 11B:
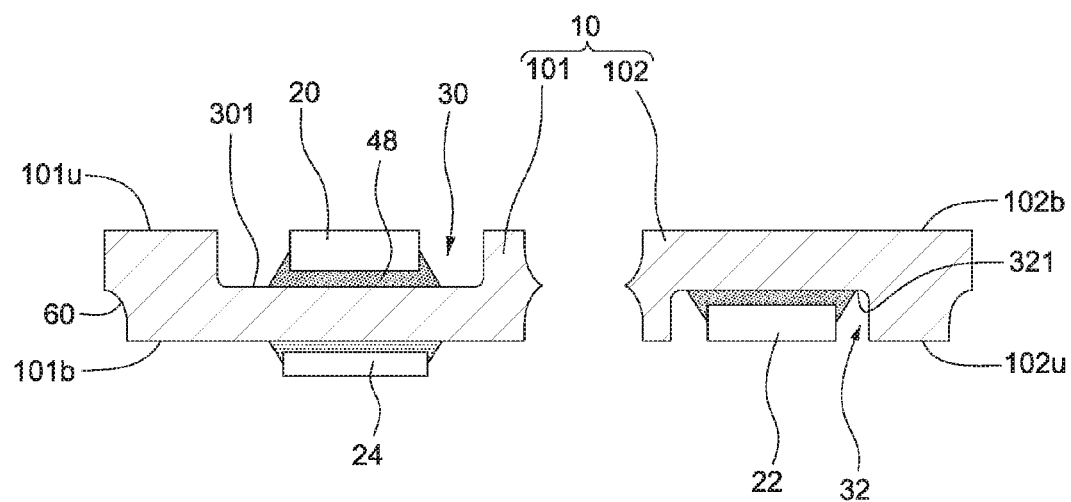

Referring to FIG. 11B, conductive adhesive layers 48 are disposed on the bottom surface 301 of the cavity 30, on the surface 101b of the conductive base 101 and on the upper surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 is used to attach the semiconductor die 20 to the bottom surface 301 of the cavity 30. The semiconductor dies 22, 24 and 26 may be disposed through the attaching of the conductive adhesive layer 48.

Figure 11C:
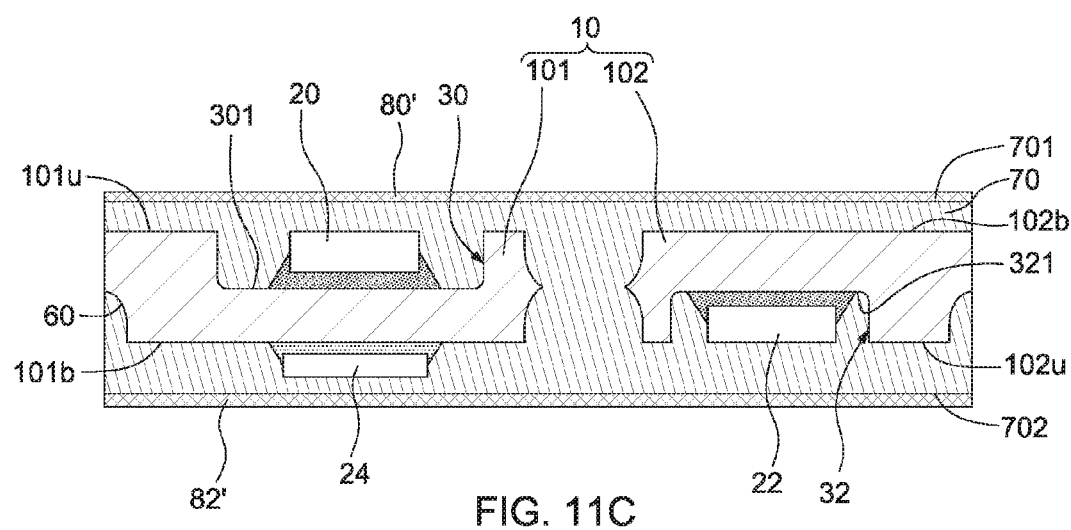

Referring to FIG. 11C, a protection layer 70 is disposed on the semiconductor dies 20, 22 and 24 and fills, at least in part, the cavities 30 and 32. The protection layer 70 has a first surface 701 and a second surface 702. In some embodiments, the material of the protection layer 70 may include a polypropylene resin; however, other suitable materials may be additionally or alternatively used. The conductive layer 80' is disposed on the surface 701 of the protection layer 70 and the conductive layer 82' is disposed on the second surface 702 of the protection layer 70. A material of conductive layer 80' and 82' may include, for example, copper or another metal, or a metal alloy, or other conductive material.

Figure 11D:
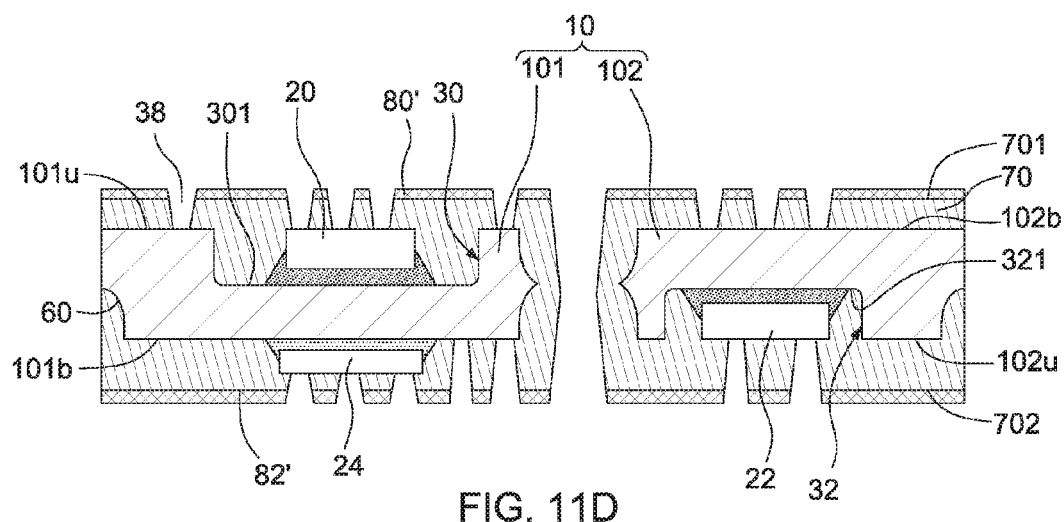

Referring to FIG. 11D, vias 38 are formed through the protection later 70 from the surface of the patterned conductive layers 80' and 82'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 11E:
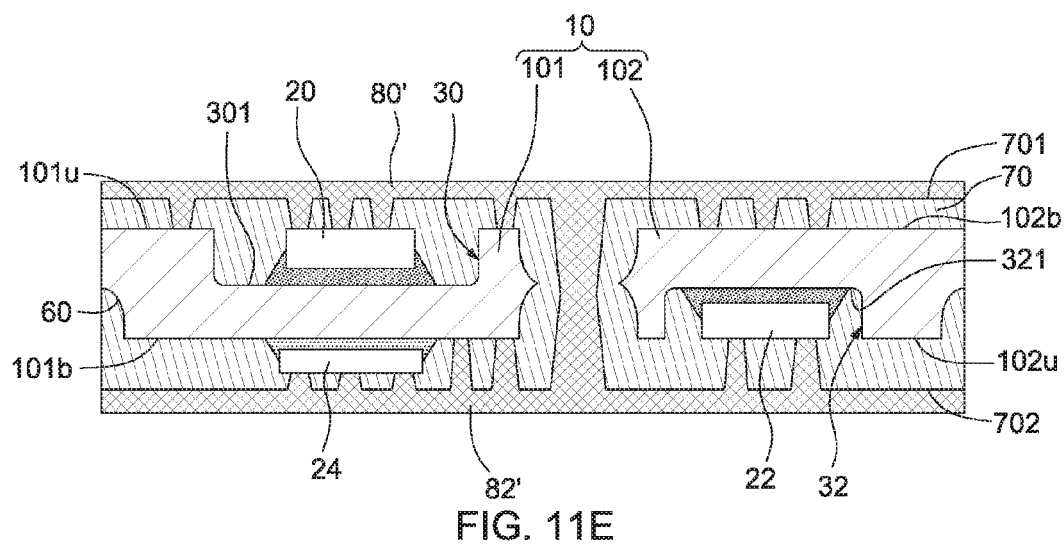

Referring to FIG. 11E, the vias 38 are filled, at least in part, with the conductive material similar to or the same as the material of the conductive layers 80' and 82'. The thickness of conductive layers 80' and 82' are increased by coating, sputtering, plating or another suitable technique.

Figure 11F:
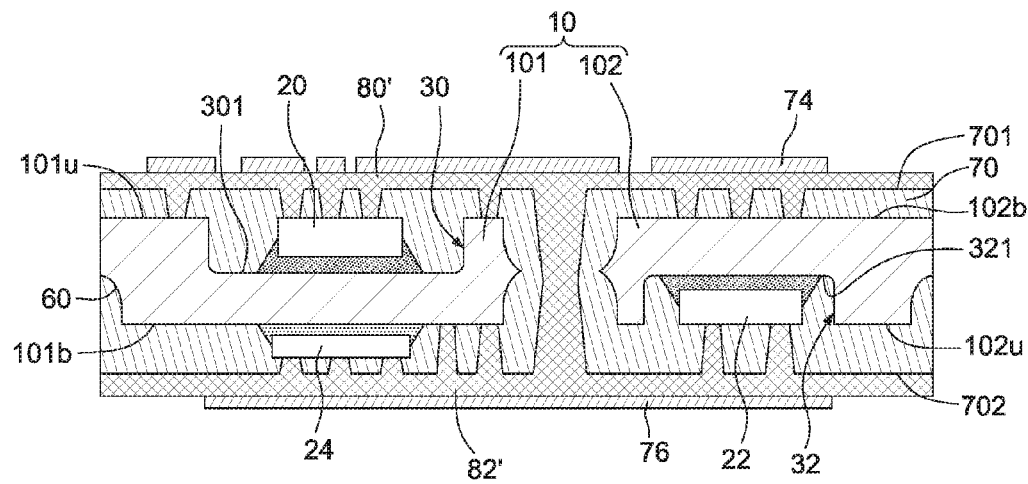

Referring to FIG. 11F, a patterned photoresist layer 74 is disposed on the conductive layers 80' and a patterned photoresist layer 76 is disposed on the conductive layer 82'. The patterned photoresist layers 74 and 76 may include a positive photoresist or other suitable material.

Figure 11G:
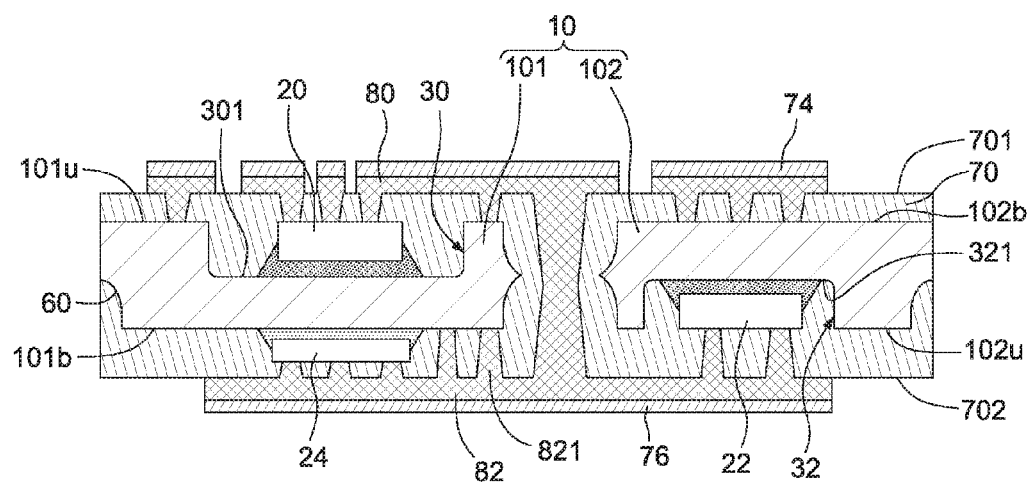
Figure 11H:
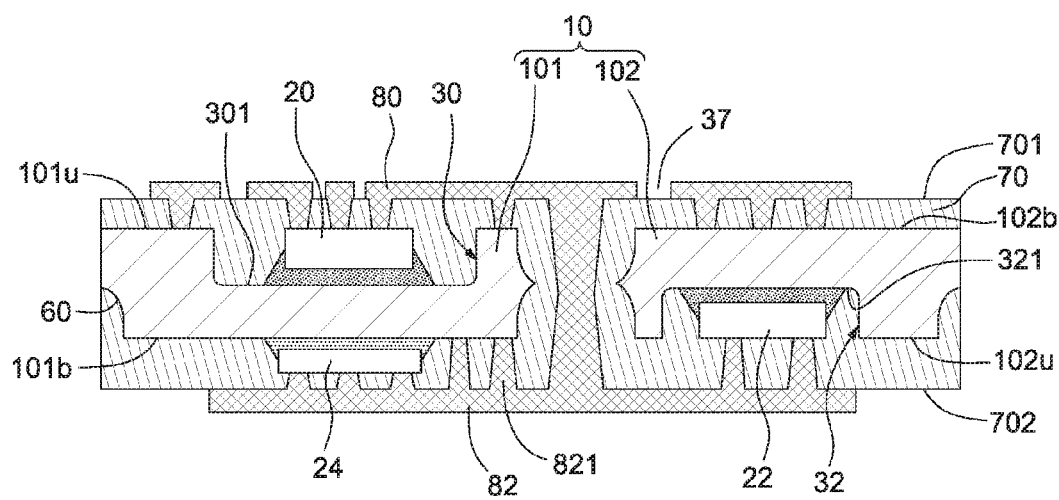

Referring to FIG. 11G, a portion of each of the conductive layers 80' and 82' is removed. After the removal, the conductive layers 80 and 82 and the interconnection structures 801 and 821 are formed. Referring to FIG. 11H, the patterned photoresist layers 74 and 76 are removed by a suitable technique, such as an etching process. After etching, a portion of the first surface 701 of the protection layer 70 is exposed and a portion of the second surface 702 of the protection layer 70 is exposed.

Figure 11I:
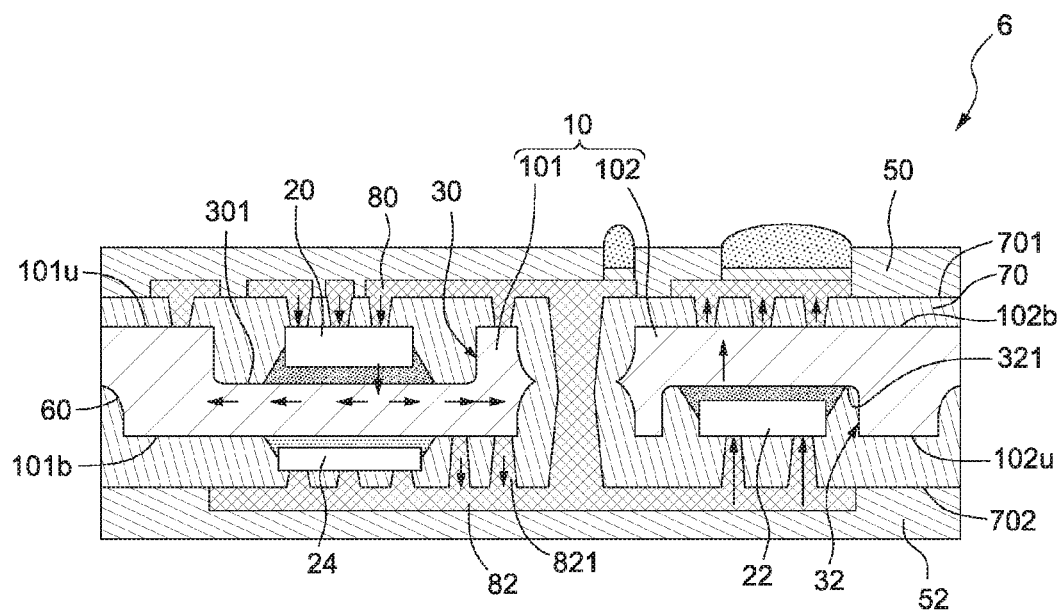

Referring to FIG. 11I, an insulating layer 50 is disposed on the first surface 701 of the protection layer 70 and an insulating layer 52 is disposed on the second surface 702 of the protection layer 70. The insulating layer 50 covers at least a portion of the patterned conductive layers 80 and the insulating layer 52 covers at least a portion of the patterned conductive layers 82. A material of one or both of the insulating layers 50 and 52 may include a polypropylene resin or other insulating materials used additionally or alternatively. Next, the conductive connects 75 are filled into or formed in the vias 37, thus forming the semiconductor device package 6. The conductive connects 75 may include one or more solder balls. The vias 37 are disposed on the patterned conductive layers 80.

Figure 12A:
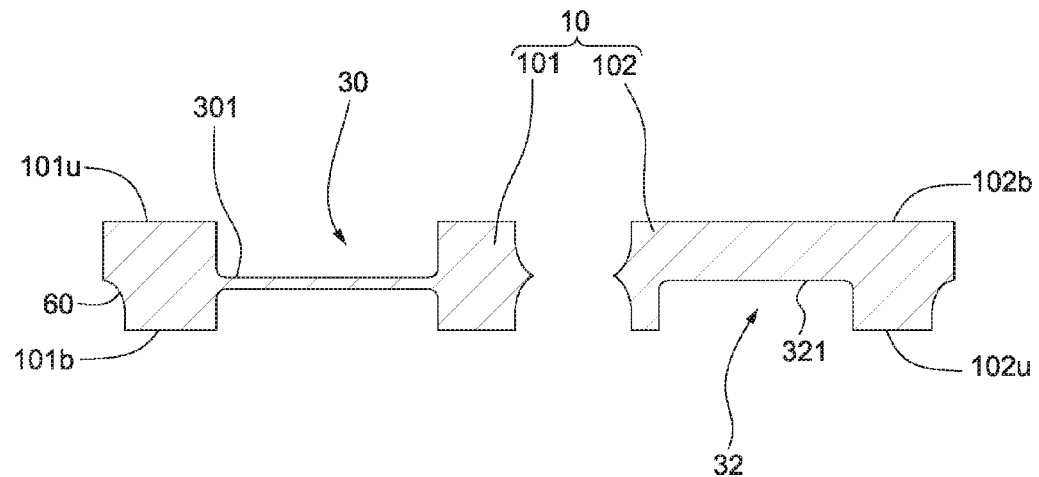
FIG. 12A, FIG. 12B, FIG. 12C, FIG. 12D, FIG. 12E, FIG. 12F, FIG. 12G, FIG. 12H, and FIG. 12I illustrate some embodiments of a method of manufacturing a semiconductor device package according to a seventh aspect.

FIGS. 12A-12I illustrate some embodiments of a method of manufacturing a semiconductor device package 7 according to a seventh aspect. Referring to FIG. 12A, conductive bases 101 and 102 are provided. The conductive base 101 has a first surface 101u and a surface 101b opposite to the first surface 101u. The conductive base 102 has a first surface 102u and a surface 102b opposite to the first surface 102u. The material of the conductive bases 101 and 102 include, for example, copper or another metal, or a metal alloy, or other conductive material. The connecting element 90 is formed, for example, by drilling (e.g. by drilling at least two holes into an initial conductive base, thereby forming the separate conductive bases 101 and 102 and the connecting element 90). The cavity 30 is defined from the first surface 101u of the conductive base 101. The cavity 32 is defined from the first surface 102u of the conductive base 102. The cavity 30 has bottom surface 301. The cavity 32 has an upper surface 321. The conductive base 101 defines one or more curved structures 60. Curved structures 60 of the conductive base 101 are smoothed, and can help to redistribute stress to avoid damage to the protection layer 70 during lamination. The structure of the conductive base 101 may be formed in a same or similar manner as the conductive base 102, such as in any appropriate manner described herein.

Figure 12B:
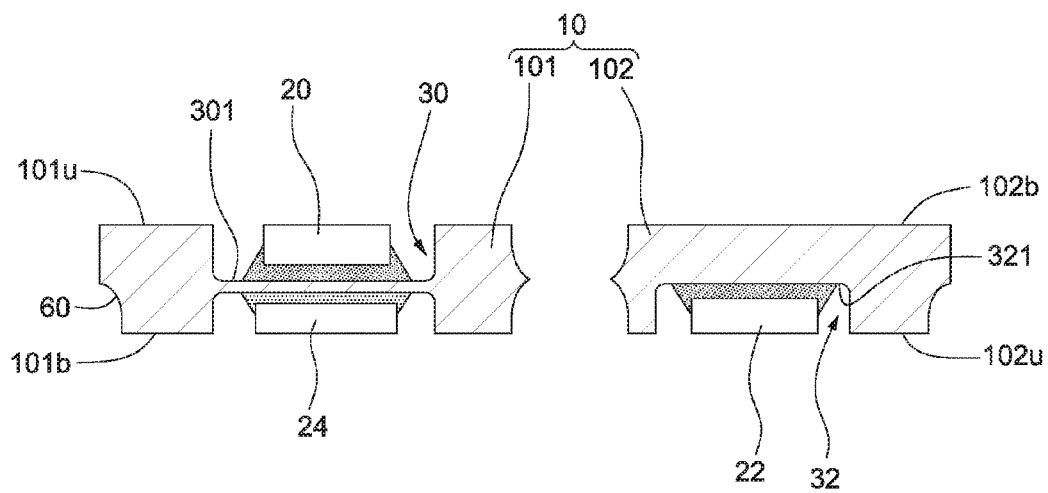

Referring to FIG. 12B, conductive adhesive layers 48 are disposed on the bottom surface 301 of the cavity 30, on the surface 101b of the conductive base 101 and on the upper surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 is used to attach the semiconductor die 20 to the bottom surface 301 of the cavity 30. The semiconductor dies 22, 24 and 26 may be disposed through the attaching of the conductive adhesive layer 48.

Figure 12C:
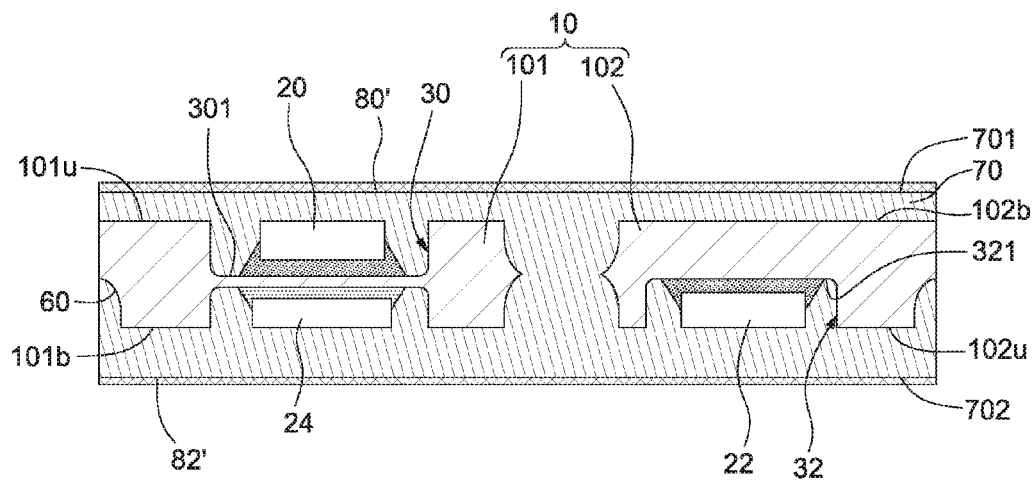

Referring to FIG. 12C, a protection layer 70 is disposed on the semiconductor dies 20, 22 and 24 and fills, at least in part, the cavities 30 and 32. The protection layer 70 has a first surface 701 and a second surface 702. In some embodiments, the material of the protection layer 70 may include a polypropylene resin; however, other suitable materials may be additionally or alternatively used. The conductive layer 80' is disposed on the surface 701 of the protection layer 70 and the conductive layer 82' is disposed on the second surface 702 of the protection layer 70. A material of conductive layer 80' and 82' may include, for example, copper or another metal, or a metal alloy, or other conductive material.

Figure 12D:
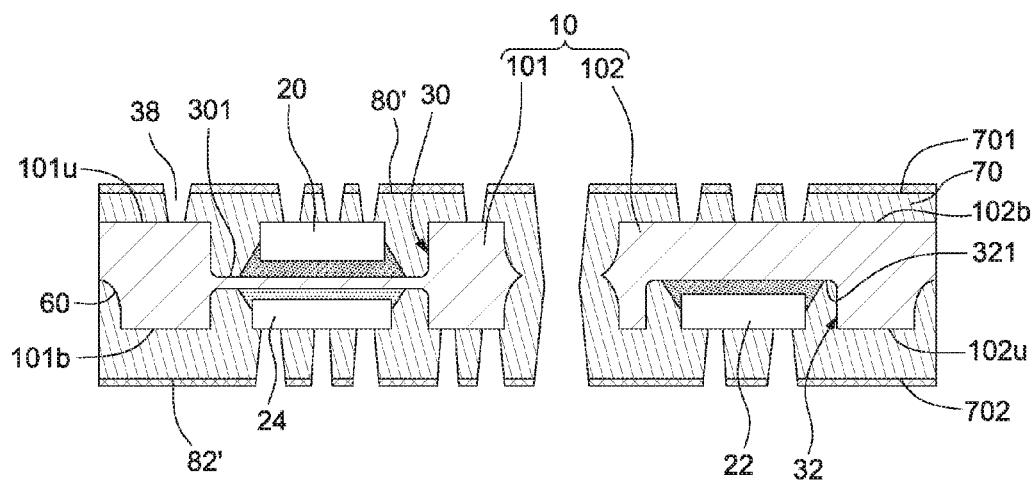

Referring to FIG. 12D, vias 38 are formed through the protection later 70 from the surface of the patterned conductive layers 80' and 82'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 12E:
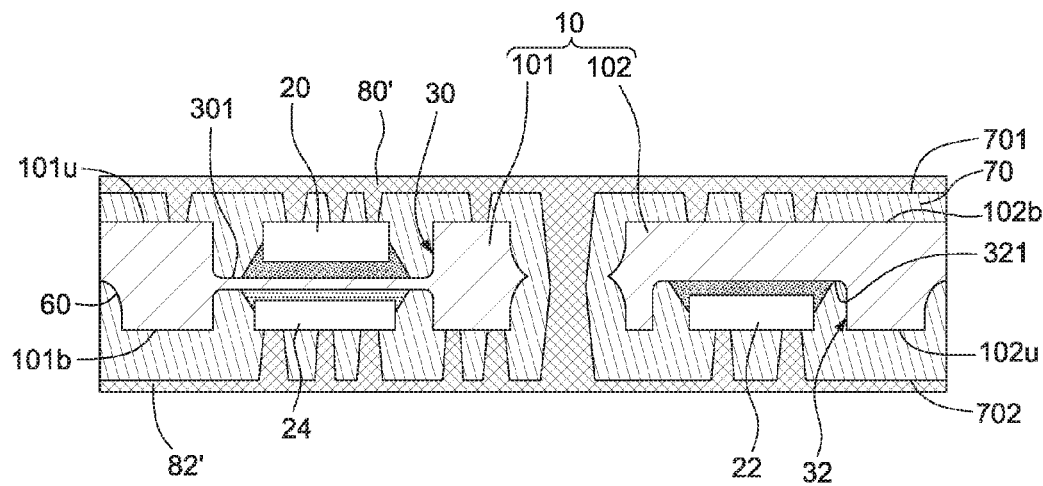

Referring to FIG. 12E, the vias 38 are filled with the conductive material similar to, or the same as, the material of the conductive layers 80' and 82'. The thickness of conductive layers 80' and 82' are increased by coating, sputtering, plating or another suitable technique.

Figure 12F:
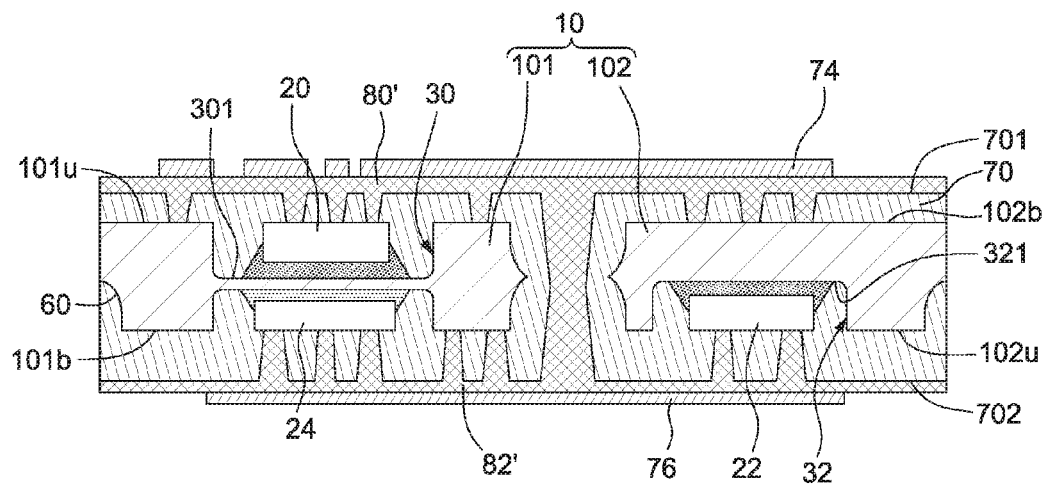

Referring to FIG. 12F, a patterned photoresist layer 74 is disposed on the conductive layers 80' and a patterned photoresist layer 76 is disposed on the conductive layer 82'. The patterned photoresist layers 74 and 76 may include a positive photoresist or other suitable material.

Figure 12G:
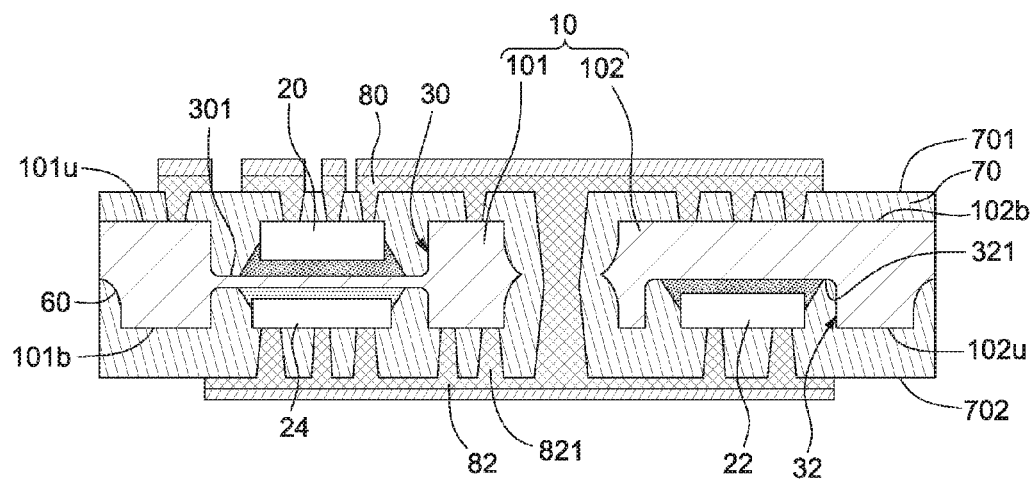
Figure 12H:
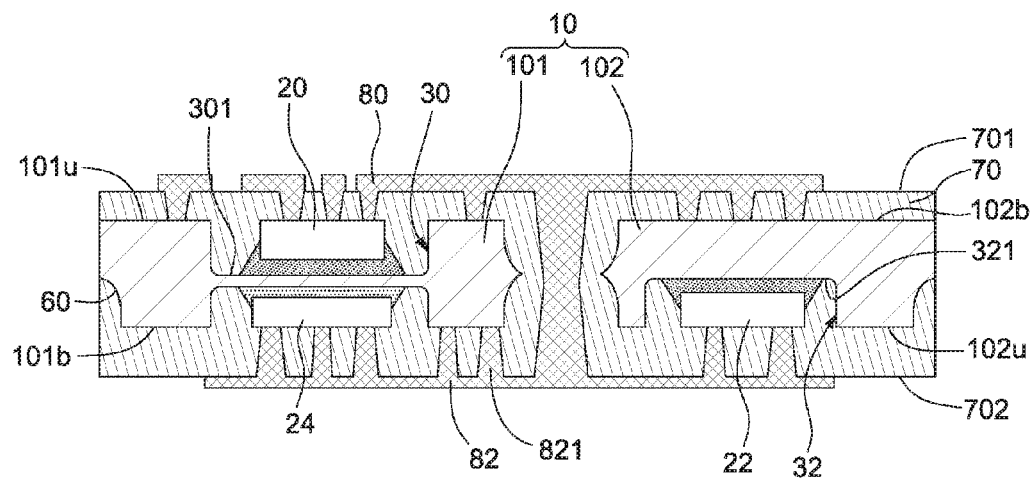

Referring to FIG. 12G, a portion of the conductive layers 80' and 82' is removed. After the removal, the conductive layers 80 and 82 and the interconnection structures 801 and 821 are formed. Referring to FIG. 12H, the patterned photoresist layers 74 and 76 are removed by a suitable technique, such as an etching process. After etching, a portion of the first surface 701 of the protection layer 70 is exposed and a portion of the second surface 702 of the protection layer 70 is exposed.

Figure 12I:
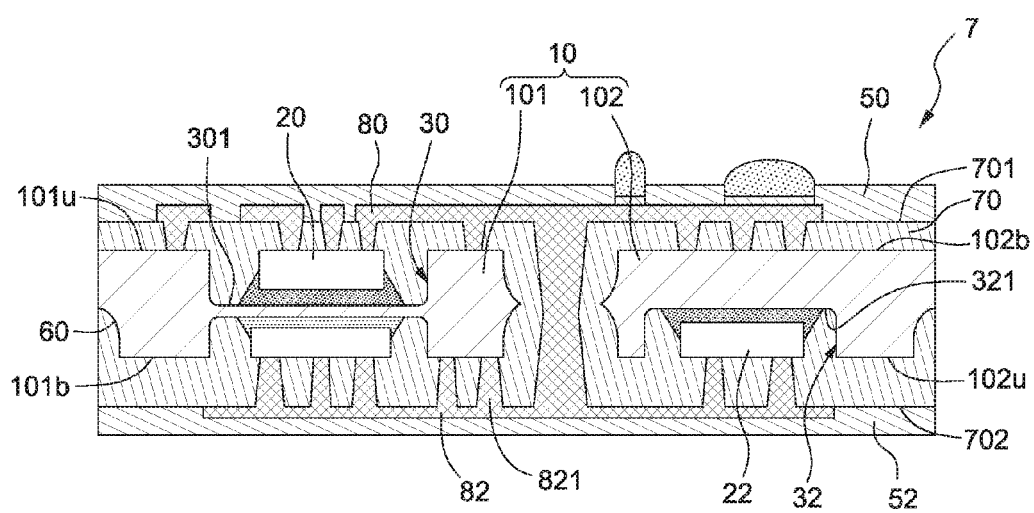

Referring to FIG. 12I, an insulating layer 50 is disposed on the first surface 701 of the protection layer 70 and an insulating layer 52 is disposed on the second surface 702 of the protection layer 70. The insulating layer 50 covers at least a portion of the patterned conductive layers 80 and the insulating layer 52 covers at least a portion of the patterned conductive layers 82. A material of one or both of the insulating layers 50 and 52 may include a polypropylene resin or other insulating materials used additionally or alternatively. Next, the conductive connects 75 are filled into or formed in the vias 37 to form the semiconductor device package 7. The conductive connects 75 may include one or more solder balls. The vias 37 are disposed on the patterned conductive layers 80.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 µm, no greater than 1 µm, no greater than 5 µm, no greater than 10 µm, or no greater than 15 µm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first conductive base having a first surface and a second surface opposite to the first surface and defining a first cavity in the first surface of the first conductive base, the first cavity having a bottom surface;
   a first semiconductor die disposed on the bottom surface of the first cavity;
   a dielectric layer disposed on the first semiconductor die, the first surface and the second surface of the first conductive base and filling the first cavity, wherein the dielectric layer has a first surface and a second surface opposite to the first surface;
   a first patterned conductive layer disposed on the first surface of the dielectric layer;
   a second patterned conductive layer disposed on the second surface of the dielectric layer;
   a plurality of first interconnection structures disposed in the dielectric layer and electrically connected to the first semiconductor die and the first patterned conductive layer; and
   a plurality of second interconnection structures disposed in the dielectric layer and electrically connected to the second surface of the first conductive base and the second patterned conductive layer.

2. The semiconductor device package of claim 1, further comprising:
   a second conductive base having a first surface and a second surface, the first surface of the second conductive base opposite to the first surface of the first conductive base, a second cavity defined in the first surface of the second conductive base, the second cavity of the second conductive base having a top surface;
   a second semiconductor die disposed on the top surface of the second cavity, the dielectric layer encapsulating the first surface and the second surface of the second conductive base and encapsulating the second semiconductor die;
   wherein the second surface of the second conductive base is electrically connected to the first patterned conductive layer through the plurality of first interconnection structures and the second semiconductor die is electrically connected to the second patterned conductive layer through the plurality of second interconnection structures.

3. The semiconductor device package of claim 2, wherein the first die is electrically connected to the second die through the first conductive base and the second interconnection structures.

4. The semiconductor device package of claim 2, further comprising:
   a fourth die disposed on the second surface of the second conductive base, wherein the fourth die is electrically connected to the first patterned conductive layer.

5. The semiconductor device package of claim 2, wherein at least one of the first and second conductive bases defines at least one curved structure.

6. The semiconductor device package of claim 1, further comprising:
   a first solder mask disposed on the first surface of the dielectric layer; and
   a second solder mask disposed on the second surface of the dielectric layer.

7. The semiconductor device package of claim 1, further comprising:
   a third die disposed on the bottom surface of the first cavity, wherein the third die is electrically connected to the second patterned conductive layer.

8. The semiconductor device package of claim 1, further comprising:
   a connecting element disposed in the dielectric layer, wherein the connecting element is electrically connected to at least one of the first patterned conductive layer and the second patterned conductive layer.

9. The semiconductor device package of claim 8, wherein the connecting element is a metal component or a through hole filled with a conductive material.

10. A semiconductor device package, comprising:
    a conductive base having a first surface and a second surface opposite to the first surface, and defining a cavity in the first surface of the first conductive base, the cavity having a bottom surface;
    a first semiconductor die disposed on the bottom surface of the cavity;
    a second semiconductor die disposed on the first semiconductor die;
    a dielectric layer disposed on the first surface of the conductive base, the first semiconductor die and the second semiconductor die and filling the cavity, wherein the dielectric layer has a first surface;

a first patterned conductive layer and a second patterned conductive layer disposed on the first surface of the dielectric layer;

a plurality of first interconnection structures disposed in the dielectric layer and electrically connected to the first semiconductor die and the first patterned conductive layer; and a plurality of second interconnection structures in the dielectric layer and electrically connected to the second semiconductor die and the second patterned conductive layer.

11. The semiconductor device package of claim 10, further comprising:

a plurality of third interconnection structures disposed in the dielectric layer and electrically connected to the first surface of the conductive base and one of the first and second patterned conductive layers.

12. The semiconductor device package of claim 10, wherein the first semiconductor die has a first active surface connected to the first patterned conductive layer and a second surface on the bottom surface of the cavity, and the second semiconductor die has a first active surface connected to the second patterned conductive layer and a second surface on the first active surface of the first semiconductor die.

13. The semiconductor device package of claim 12, wherein the first semiconductor die and the second semiconductor die are laterally offset.

14. The semiconductor device package of claim 10, further comprising a surface finish layer on the second surface of the conductive base.

15. An semiconductor device package, comprising:

a conductive base having a first surface and a second surface opposite to the first surface, and defining a cavity in the first surface of the conductive base, the cavity having a bottom surface;

a first semiconductor die disposed on the bottom surface of the cavity;

a first dielectric layer disposed on the first surface of the conductive base and the first semiconductor die, wherein the first dielectric layer has a first surface;

a first patterned conductive layer disposed on the first dielectric layer and electrically connected to the first semiconductor die;

a second semiconductor die disposed on the first patterned conductive layer;

a second dielectric layer disposed on the first patterned conductive layer, the first surface of the first dielectric layer, and the second semiconductor die; and a second patterned conductive layer disposed on the second dielectric layer and electrically connected to the second semiconductor die.

16. The semiconductor device package of claim 15, further comprising:

a plurality of interconnection structures disposed in the first dielectric layer and electrically connected to the first semiconductor die and the first patterned conductive layer.

17. The semiconductor device package of claim 15, further comprising:

a plurality of interconnection structures disposed in the first dielectric layer and electrically connected to the first surface of the conductive base and the first patterned conductive layer.

18. The semiconductor device package of claim 15, further comprising:

a plurality of interconnection structures disposed in the second dielectric layer and electrically connected to the first patterned conductive layer and the second patterned conductive layer.

19. The semiconductor device package of claim 15, further comprising:

a plurality of interconnection structures disposed in the second dielectric layer and electrically connected to the second semiconductor die and the second patterned conductive layer.

20. The semiconductor device package of claim 15, further comprising:

a third die disposed in the cavity and electrically connected to the first patterned conductive layer.

* * * * *